United States Patent
Takahashi et al.

(10) Patent No.: US 9,881,954 B2
(45) Date of Patent: Jan. 30, 2018

(54) IMAGING DEVICE

(71) Applicant: Semiconductor Energy Laboratory Co., Ltd., Atsugi-shi, Kanagawa-ken (JP)

(72) Inventors: Hironobu Takahashi, Tochigi (JP); Yukinori Shima, Gunma (JP); Kengo Akimoto, Tochigi (JP); Junichi Koezuka, Tochigi (JP); Naoto Kusumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/731,954

(22) Filed: Jun. 5, 2015

(65) Prior Publication Data
US 2015/0364513 A1 Dec. 17, 2015

(30) Foreign Application Priority Data

Jun. 11, 2014 (JP) .................................. 2014-120472

(51) Int. Cl.
*H01L 27/146* (2006.01)
*H01L 29/786* (2006.01)
*H01L 27/12* (2006.01)

(52) U.S. Cl.
CPC .... *H01L 27/14616* (2013.01); *H01L 27/1225* (2013.01); *H01L 27/14632* (2013.01); *H01L 27/14663* (2013.01)

(58) Field of Classification Search
None
See application file for complete search history.

(56) References Cited

U.S. PATENT DOCUMENTS

| | | | |
|---|---|---|---|
| 6,243,440 | B1 | 6/2001 | Oikawa et al. |
| 7,674,650 | B2 | 3/2010 | Akimoto et al. |
| 8,378,391 | B2 | 2/2013 | Koyama et al. |
| 8,586,905 | B2 | 11/2013 | Kurokawa |
| 8,610,696 | B2 | 12/2013 | Kurokawa |
| 8,654,231 | B2 | 2/2014 | Kurokawa et al. |
| 8,716,646 | B2 | 5/2014 | Hirose |
| 8,716,712 | B2 | 5/2014 | Kozuma et al. |
| 8,766,338 | B2 | 7/2014 | Kurokawa et al. |
| 8,836,626 | B2 | 9/2014 | Ikeda |
| 8,928,644 | B2 | 1/2015 | Kurokawa et al. |

(Continued)

FOREIGN PATENT DOCUMENTS

| | | |
|---|---|---|
| JP | 11-311673 A | 11/1999 |
| JP | 2007-096055 A | 4/2007 |

(Continued)

*Primary Examiner* — Michael Lebentritt
*Assistant Examiner* — Jordan Klein
(74) *Attorney, Agent, or Firm* — Fish & Richardson P.C.

(57) ABSTRACT

An imaging device with high imaging quality capable of being manufactured at low cost is provided. The imaging device includes a first transistor, a second transistor, a third transistor, a fourth transistor, a photodiode, and a capacitor. Each of the first to the fourth transistors includes a first gate electrode and a second gate electrode, and the second gate electrode of each of the first to the fourth transistors and one electrode of the capacitor are electrically connected to an anode electrode of the photodiode.

26 Claims, 20 Drawing Sheets

(56) References Cited

U.S. PATENT DOCUMENTS

| | | |
|---|---|---|
| 8,947,155 B2 | 2/2015 | Takahashi et al. |
| 8,952,313 B2 | 2/2015 | Tamura |
| 8,987,651 B2 | 3/2015 | Kurokawa |
| 8,994,891 B2 | 3/2015 | Yamazaki et al. |
| 9,006,635 B2 | 4/2015 | Kurokawa et al. |
| 2002/0030193 A1* | 3/2002 | Yamazaki ........... H01L 51/5281 257/98 |
| 2008/0151262 A1* | 6/2008 | Tanaka ................ G03F 7/70383 356/601 |
| 2010/0134735 A1 | 6/2010 | Nakamura et al. |
| 2011/0109591 A1 | 5/2011 | Kurokawa et al. |
| 2011/0109592 A1 | 5/2011 | Kurokawa et al. |
| 2011/0176038 A1 | 7/2011 | Kurokawa et al. |
| 2011/0221723 A1 | 9/2011 | Kurokawa et al. |
| 2012/0002090 A1 | 1/2012 | Aoki et al. |
| 2012/0085892 A1* | 4/2012 | Hirose ...................... G01J 1/44 250/214.1 |
| 2012/0104238 A1* | 5/2012 | Hirose ...................... G01J 1/46 250/214 R |
| 2012/0286143 A1 | 11/2012 | Hirose |
| 2013/0162778 A1 | 6/2013 | Kurokawa |
| 2013/0234027 A1* | 9/2013 | Kurokawa ........ H01L 27/14643 250/338.4 |
| 2013/0250274 A1 | 9/2013 | Kurokawa |
| 2013/0285046 A1 | 10/2013 | Yamazaki |
| 2013/0320333 A1 | 12/2013 | Koyama et al. |
| 2014/1005446 | 2/2014 | Kurokawa et al. |
| 2015/0021598 A1 | 1/2015 | Ikeda et al. |
| 2015/0263052 A1 | 9/2015 | Yamazaki et al. |
| 2015/0263053 A1 | 9/2015 | Yamazaki et al. |
| 2015/0279884 A1 | 10/2015 | Kusumoto |
| 2015/0296162 A1 | 10/2015 | Kurokawa et al. |
| 2015/0311245 A1 | 10/2015 | Yamazaki et al. |
| 2015/0340511 A1* | 11/2015 | Yan ................... H01L 29/66969 257/43 |
| 2015/0349129 A1 | 12/2015 | Ikeda |

FOREIGN PATENT DOCUMENTS

| | | |
|---|---|---|
| JP | 2007-123861 A | 5/2007 |
| JP | 2011-119711 A | 6/2011 |

* cited by examiner

FIG. 10C1  FIG. 10C2  FIG. 10C3

IMAGING DEVICE

BACKGROUND OF THE INVENTION

1. Field of the Invention

One embodiment of the present invention relates to an imaging device.

One embodiment of the present invention is not limited to the above technical field. Specifically, examples of the technical field of one embodiment of the present invention disclosed in this specification include a semiconductor device, a display device, a liquid crystal display device, a light-emitting device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic appliance includes a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) and a display device. As semiconductor materials which can be used for the transistors, silicon-based semiconductors have been widely used, but oxide semiconductors have been attracting attention as alternative materials.

For example, a technique for forming a transistor using zinc oxide or an In—Ga—Zn-based oxide as an oxide semiconductor is disclosed (see Patent Documents 1 and 2).

Patent Document 3 discloses that an imaging device in which a transistor including an oxide semiconductor and having an extremely low off-state current is used in part of a pixel circuit and a transistor including silicon with which a complementary metal oxide semiconductor (CMOS) circuit can be formed is used in a peripheral circuit.

PATENT DOCUMENT

[Patent Document 1] Japanese Published Patent Application No. 2007-123861
[Patent Document 2] Japanese Published Patent Application No. 2007-096055
[Patent Document 3] Japanese Published Patent Application No. 2011-119711

SUMMARY OF THE INVENTION

In view of the use in various environments, imaging devices are required to have high imaging quality even in a low illuminance environment and in the case of taking an image of a moving subject. Furthermore, an imaging device which satisfies the requirement and achieves low fabrication cost and high reliability is demanded.

For example, in an imaging device for obtaining a radiation image, transistors whose electrical characteristics are less fluctuated by radiation are desirably used.

When an impurity such as hydrogen is mixed to an oxide semiconductor, physical properties of the oxide semiconductor are easily changed. Thus, it is desirable that a transistor including an oxide semiconductor and the periphery thereof have a structure in which an impurity such as hydrogen does not easily enter the oxide semiconductor and the periphery thereof.

An object of one embodiment of the present invention is to provide a highly reliable imaging device. Another object of one embodiment of the present invention is to provide an imaging device formed at low cost. Another object of one embodiment of the present invention is to provide an imaging device with a high aperture ratio. Another object of one embodiment of the present invention is to provide an imaging device capable of taking an image under a low illuminance condition. Another object of one embodiment of the present invention is to provide an imaging device with a wide dynamic range. Another object of one embodiment of the present invention is to provide an imaging device with high resolution. Another object of one embodiment of the present invention is to provide a highly integrated imaging device. Another object of one embodiment of the present invention is to provide an imaging device which can be used in a wide temperature range. Another object of one embodiment of the present invention is to provide an imaging device with low power consumption. Further, another object is to provide a semiconductor device including the imaging device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device including a photodiode and a transistor formed using an oxide semiconductor.

Another embodiment of the present invention is an imaging device including a first transistor, a second transistor, a third transistor, a fourth transistor, a photodiode, and a capacitor. The first to the fourth transistors each include a first gate electrode and a second gate electrode. One of a source electrode and a drain electrode of the first transistor is electrically connected to a cathode electrode of the photodiode. The other of the source electrode and the drain electrode of the first transistor is electrically connected to the first gate electrode of the second transistor. One of a source electrode and a drain electrode of the second transistor is electrically connected to one of a source electrode and a drain electrode of the third transistor. One of a source electrode and a drain electrode of the fourth transistor is electrically connected to the other of the source electrode and the drain electrode of the first transistor. One electrode of the capacitor is electrically connected to the other of the source electrode and the drain electrode of the first transistor. The second gate electrode of each of the first to the fourth transistors is electrically connected to the anode electrode of the photodiode. The other electrode of the capacitor is electrically connected to the anode electrode of the photodiode.

In the imaging device, each of the first to the fourth transistors preferably includes an oxide semiconductor layer, and the oxide semiconductor layer includes In, Zn, and M (M is Al, Ti, Sn, Ga, Y, Zr, La, Ce, Nd, or Hf).

Another embodiment of the present invention is an imaging device including a transistor, a photodiode, and a capacitor. The transistor includes a first electrode, a first insulating film in contact with the first electrode, a first semiconductor layer in contact with the first insulating film, and a second electrode and a third electrode which are in contact with the first semiconductor layer. The photodiode includes a fourth electrode, a fifth electrode, and a second semiconductor layer between the fourth electrode and the fifth electrode. The first semiconductor layer includes a region in contact with a second insulating layer. The second electrode includes a region in contact with the second insulating layer. The third electrode includes a region in contact with the second insulating layer. The second insulating layer includes a region in contact with a third insulating layer. The third insulating layer includes a region in contact with a fourth insulating layer. The fourth insulating layer includes a region in contact with the fourth electrode. The third insulating layer includes a region in contact with the fourth electrode in a region overlapping with the first electrode. The fifth electrode is electrically connected to the second electrode. The capacitor includes an extending region of the third electrode, the second insulating layer, the third insulating layer, and the fourth electrode.

The photodiode further includes a third semiconductor layer in contact with the fourth electrode and a fourth semiconductor layer in contact with the fifth electrode, and the second semiconductor layer that is in contact with and sandwiched between the third semiconductor layer and the fourth semiconductor layer. The third semiconductor layer can have p-type conductivity. The fourth semiconductor layer can have n-type conductivity. The second semiconductor layer can have i-type conductivity.

The photodiode can include a region where the fourth semiconductor layer is removed in a region overlapping with the first electrode layer.

The photodiode can include a region where the second semiconductor layer and the fourth semiconductor layer are removed in a region overlapping with the first electrode layer.

The photodiode can include a region where the second semiconductor layer, the third semiconductor layer, and the fourth semiconductor layer are removed in a region overlapping with the first electrode layer.

The first semiconductor layer preferably includes an oxide semiconductor layer, and the oxide semiconductor layer preferably includes In, Zn, and M (M is Al, Ti, Sn, Ga, Y, Zr, La, Ce, Nd, or Hf).

According to one embodiment of the present invention, a high reliable imaging device can be provided. Alternatively, an imaging device which is formed at low cost can be provided. Alternatively, an imaging device with a high aperture ratio can be provided. Alternatively, an imaging device capable of taking an image under a low illuminance condition can be provided. Alternatively, an imaging device with a wide dynamic range can be provided. Alternatively, an imaging device with high resolution can be provided. Alternatively, a highly integrated imaging device can be provided. Alternatively, an imaging device which can be used in a wide temperature range can be provided. Alternatively, an imaging device with low power consumption can be provided. Alternatively, a semiconductor device including the imaging device can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIGS. 10A and 10B are cross-sectional views each illustrating a pixel of an imaging device and FIGS. 10C1, 10C2, and 10C3 are cross-sectional views each illustrating an end portion of a photodiode;

DETAILED DESCRIPTION OF THE INVENTION

Figure 1A:
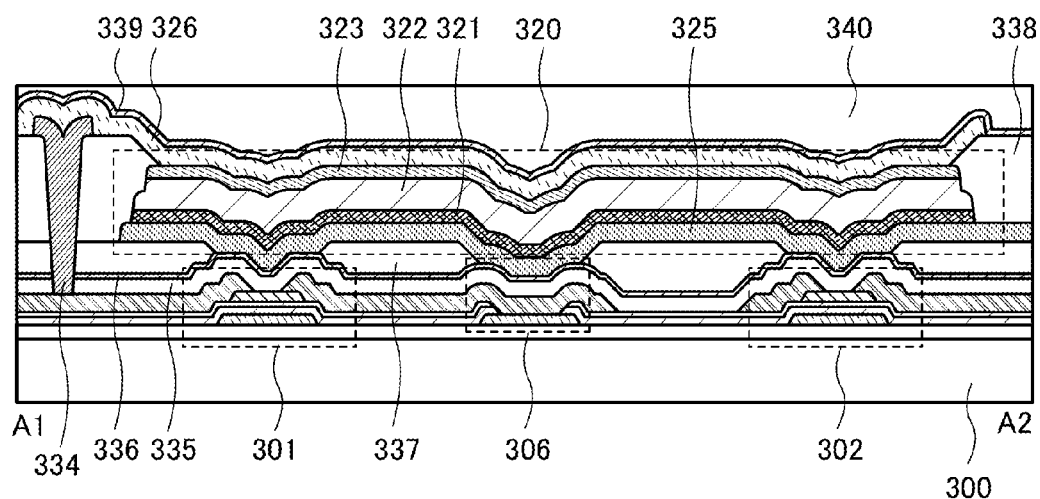
FIGS. 1A and 1B are a cross sectional view and a circuit diagram of a pixel of an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without limitation on a predetermined connection relation, for example, the connection relation illustrated in the drawings and the texts.

Here, X and Y each denote a device, an element, a circuit, a line, an electrode, a terminal, a conductive film, a layer, or the like.

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes a device, an element, a circuit, a wiring, an electrode, a terminal, a conductive film, a layer, or the like.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

Figure 1B:
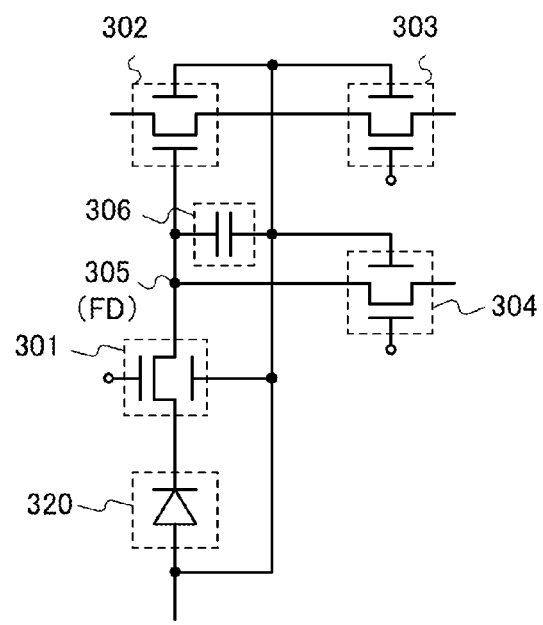

In this embodiment, a structure of an imaging device that is one embodiment of the present invention is described with reference to drawings. FIG. 1A is a cross-sectional view of a pixel of the imaging device of one embodiment of the present invention. FIG. 1B is a pixel circuit of the imaging device of one embodiment of the present invention.

The pixel of the imaging device includes a transistor 301, a transistor 302, a transistor 303 (not shown in FIG. 1A), and a transistor 304 (not shown in FIG. 1A), which are formed over a substrate 300. The transistors are each a bottom-gate transistor including a first gate electrode layer, a first gate insulating film, a semiconductor layer, a source electrode layer, and a drain electrode layer as a basic structure.

A photodiode 320 is provided over the transistor with an insulating layer 335, an insulating layer 336, and an insulating layer 337 therebetween.

The photodiode 320 includes a semiconductor layer between a conductive layer 325 and a conductive layer 326. The semiconductor layer includes a p-type semiconductor layer 321 in contact with the conductive layer 325, an n-type semiconductor layer 323 in contact with the conductive layer 326, and an i-type semiconductor layer 322 between the p-type semiconductor layer 321 and the n-type semiconductor layer 323. The conductive layer 325 and the conductive layer 326 can function as an anode electrode and a cathode electrode of the photodiode 320, respectively.

An insulating layer 338 functioning as a planarization film is formed over an end portion of the photodiode 320, and an insulating layer 339 functioning as a protective film is formed thereover. Furthermore, an insulating layer 340 functioning as a planarization film is formed over the insulating layer 339.

Although the conductive layer 326 is electrically connected to one of the source electrode layer and the drain electrode layer of the transistor 301 through a conductive layer 334, one embodiment of the present invention is not limited thereto. For example, the conductive layer 326 may be in direct contact with and electrically connected to one of the source electrode layer and the drain electrode layer of the transistor 301. Alternatively, the conductive layer 326 may be electrically connected to one of the source electrode layer and the drain electrode layer through a plurality of conductive layers including the conductive layer 334 therebetween.

The pixel of the imaging device of one embodiment of the present invention may have a structure in which part of the above-described conductive layers, part of the above-described insulating layers, or part of components such as a transistor and a capacitor is not included. Furthermore, a conductive layer, an insulating layer, a transistor, a capacitor, and the like except for the above may be additionally provided.

In a region where the first gate electrode layers or the semiconductor layers of the transistors overlap with the photodiode 320, the insulating layer 336 is in contact with the conductive layer 325. With such a structure, an electric field can be applied from the conductive layer 325 to the semiconductor layers of the transistors through the insulating layer 335 and the insulating layer 336. That is, the conductive layer 325 can function as a second gate electrode layer, and the insulating layer 335 and the insulating layer 336 can function as a second gate insulating film.

Such a structure can be obtained by partly removing the insulating layer 337.

Figure 10A:
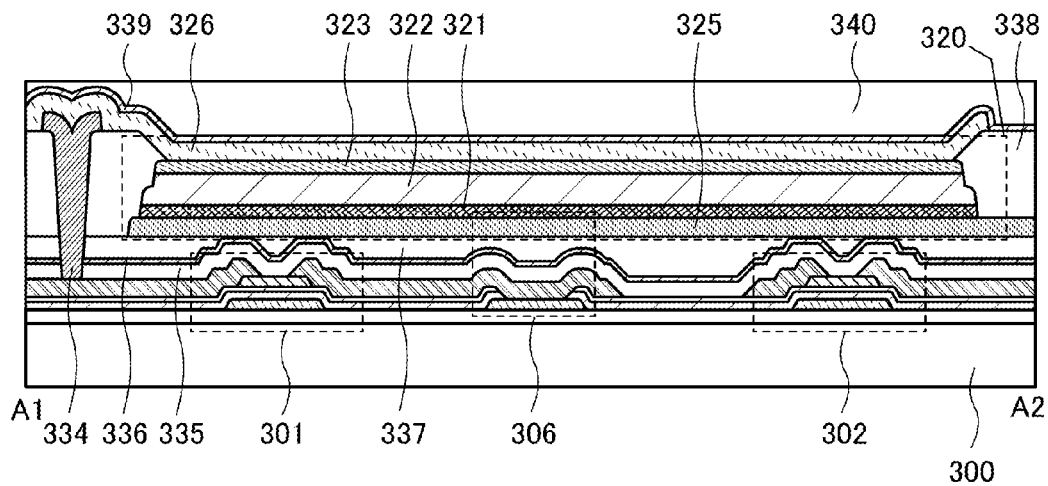

In case where the insulating layer 337 is formed thin as shown in FIG. 10A, that is, in the case where the insulating layer 337 is formed so that the insulating layer 336 is partly exposed, any part of the insulating layer 337 is not necessary to be removed.

The imaging device of one embodiment of the present invention includes a capacitor 306 in which part of an extending region of the source electrode layer or the drain electrode layer of the transistor serves as one electrode, the insulating layer 335 and the insulating layer 336 serve as a dielectric, and part of the conductive layer 325 serves as the other electrode. The insulating layer 337 is partly removed in a manner similar to that for forming the second gate electrode layers of the transistors so that the part of the conductive layer 325 serves as the other electrode.

The semiconductor layers included in the transistors 301, 302, 303 and 304 are preferably formed using oxide semiconductors. Extremely low off-state current characteristics of the transistor including an oxide semiconductor can widen the dynamic range of imaging. As described in detail later, in the circuit shown in FIG. 1B, an increase in the intensity of light entering the photodiode 320 reduces the potential of the charge storage portion 305 (FD). Since the transistor using an oxide semiconductor has an extremely low off-state current, a current corresponding to the gate potential can be accurately output even when the gate potential is extremely low. Thus, it is possible to broaden the detection range of illuminance, i.e., the dynamic range.

A period during which charge can be retained in the charge storage portion 305 (FD) can be extremely long owing to the low off-state current characteristics of the transistors 301 and 304. Therefore, a global shutter system, in which charge accumulation operation is performed in all pixel circuits at the same time, can be used without a complicated circuit configuration and operation method, and thus, an image with little distortion can be easily obtained even in capturing a moving object. Furthermore, exposure time (a period for conducting charge accumulation operation) can be long in a global shutter system; thus, the imaging device is suitable for imaging even in a low illuminance environment.

Note that the use of the oxide semiconductors for the semiconductor layers of the transistors 301, 302, 303, and 304 is one example, and silicon or the like may be used for the semiconductor layers. Alternatively, a structure in which a transistor including an oxide semiconductor and a transistor including silicon are both used may be employed. For example, a structure can be employed in which oxide semiconductors are used for the semiconductor layers of the transistors 301 and 304 and silicon is used for the semiconductor layers of the transistors 302 and 303.

The insulating layer 335 is a film functioning as the second gate insulating film, and is preferably a film in which defects are less likely to be generated at the interface with the semiconductor layer of the transistor. For the insulating layer 335, typically, a silicon oxide film, a silicon oxynitride film, or the like can be used.

The insulating layers 337, 338, and 340 are films functioning as planarization films. For example, a resin film such as an acrylic resin film or a polyimide resin film can be used as well as an inorganic film such as a silicon oxide film.

As a semiconductor layer included in the photodiode 320, amorphous silicon is preferably used for the i-type semiconductor layer 322. The p-type semiconductor layer 321 and the n-type semiconductor layer 323 can each be formed using amorphous silicon, microcrystalline silicon, or the like which includes a dopant imparting the corresponding conductivity type. A photodiode in which a photoelectric conversion layer is formed using amorphous silicon has high sensitivity in a visible region, and therefore can easily sense weak visible light. Note that microcrystalline silicon or polycrystalline silicon may be used for the i-type semiconductor layer 322.

It is preferable that the end portion of the photodiode 320 have a shape with a step between the n-type semiconductor layer 323 and the p-type semiconductor layer 321 as shown in FIG. 1A. In other word, at least one of the side surfaces of the n-type semiconductor layer 323, the i-type semiconductor layer 322, and the p-type semiconductor layer 321 preferably exists in a different plane. With this structure, resistance between the n-type semiconductor layer 323 and the p-type semiconductor layer 321 at the end portion of the photodiode 320 can be increased, so that leakage current between the anode electrode and the cathode electrode of the photodiode 320 can be reduced.

The same effect can be obtained even when the end portion of the photodiode 320 has any of shapes shown in FIGS. 10C1 to 10C3. Although not shown in the figures, end faces of the n-type semiconductor layer 323, i-type semiconductor layer 322, and p-type semiconductor layer 321 may be continuous with a taper shape.

For the conductive layer 326 in contact with the photodiode 320, a light-transmitting conductive film can be used. That is, a surface on the conductive layer 326 side of the photodiode 320 is a light-receiving surface. For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, and the like. The conductive layer 326 is not limited to a single layer and may be a stack of the above-described light-transmitting conductive films.

Figure 10B:
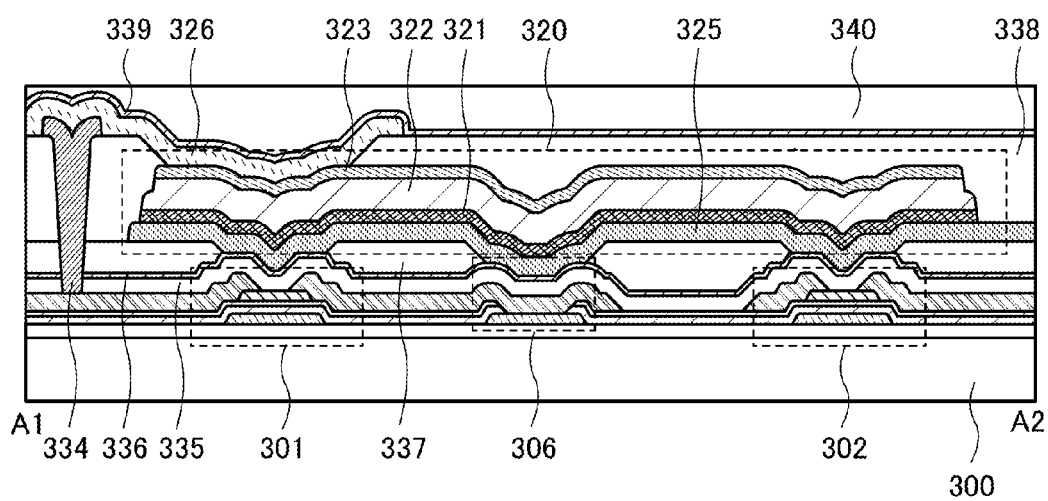
Figure 10B:
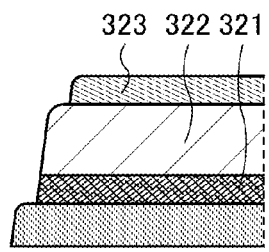
Figure 10B:
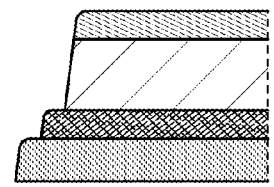
Figure 10B:
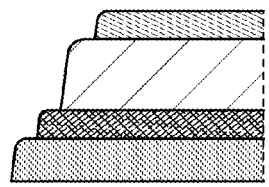

An example in which the n-type semiconductor layer 323 is fully covered by the conductive layer 326 is shown in the cross-sectional view in FIG. 1A; however, as shown in FIG. 10B, a structure in which part of the n-type semiconductor layer 323 is covered by the conductive layer 326 may be employed. At this time, a metal film or the like having no light-transmitting property may be used for the conductive layer 326.

Here, the pixel of the imaging device of one embodiment of the present invention has a structure in which the transistors and the photodiode 320 are stacked.

Dangling bonds of silicon are terminated with hydrogen in the semiconductor layers included in the photodiode 320. Thus, electrical characteristics and reliability of the photodiode 320 can be improved owing to the hydrogen. In the case of using an oxide semiconductor for the semiconductor layer of the transistors, hydrogen in the insulating layers in the vicinity of the semiconductor layers causes generation of carriers in the semiconductor layers. Accordingly, the hydrogen may reduce the reliability of the transistors. Therefore, in the case where the photodiode including a silicon-based semiconductor material and the transistors including an oxide semiconductor are stacked, it is preferable that a hydrogen barrier film having a function of preventing diffusion of hydrogen be provided therebetween.

The hydrogen barrier film can be formed using, for example, silicon nitride, aluminum oxide, aluminum nitride, aluminum oxynitride, aluminum nitride oxide, gallium oxide, gallium oxynitride, yttrium oxide, yttrium oxynitride, hafnium oxide, hafnium oxynitride, yttria-stabilized zirconia (YSZ), or the like.

In the structure shown in FIG. 1A, the hydrogen barrier film can be used for the insulating layer 336. Thus, diffusion of hydrogen from the photodiode 320 to the transistor side can be prevented; so that, the reliability of the transistors can be improved. Note that the insulating layer 339 can also be formed using a material which can be used as the hydrogen barrier film.

For the conductive layer 325 in contact with the photodiode 320, typically, a metal such as titanium, aluminum, tungsten, molybdenum, or tantalum, or a light-transmitting conductive film which can be used for the conductive layer 326 can be used. Note that the use of a conductive layer with hydrogen barrier properties for the conductive layer 325 can further increase an effect of preventing diffusion of hydrogen from the photodiode 320 to the transistor side.

The conductive layer with hydrogen barrier properties can be formed using, for example, a metal nitride such as titanium nitride, tantalum nitride, or titanium aluminum nitride. Thus, a single layer of the nitride, a stack of the metal and the nitride, a stack of the light-transmitting conductive film and the nitride, or the like may be used as the conductive layer 325.

Note that the amount of hydrogen diffused from the photodiode 320 to the transistor is significantly affected by the absolute amount of hydrogen contained in the photodiode 320. Thus, adjustment of the hydrogen concentration in the i-type semiconductor layer 322 which has a particularly large volume is effective in reducing the diffused hydrogen. For example, when amorphous silicon is used for the i-type semiconductor layer 322, the concentration of hydrogen in the film is desirably less than or equal to 5%. Furthermore, the thickness of the i-type semiconductor layer 322 is less than or equal to 400 nm, preferably less than or equal to 300 nm, further preferably less than or equal to 200 nm. Furthermore, for the i-type semiconductor layer 322, it is also effective to use microcrystalline silicon or polycrystalline silicon which has a lower concentration of hydrogen than amorphous silicon.

Furthermore, the diffused hydrogen can be reduced with a structure in which part of the photodiode 320 is removed in a region which is near the transistor.

Figure 2A:
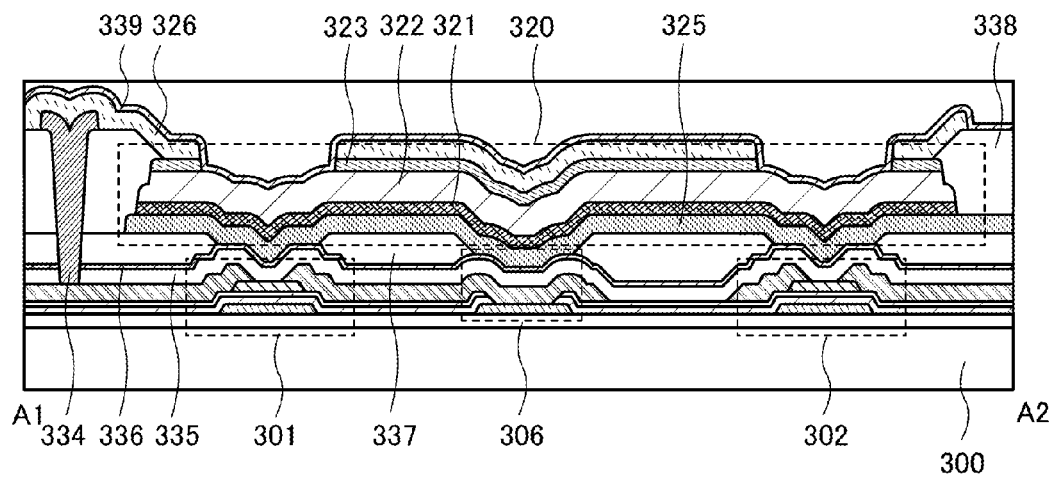
FIGS. 2A to 2C are cross-sectional views each illustrating a pixel of an imaging device.

Specifically, the conductive layer 326 and the n-type semiconductor layer 323 of the photodiode 320 may be removed in a region over the transistors (see FIG. 2A). Alternatively, the conductive layer 326, the n-type semiconductor layer 323, and the i-type semiconductor layer 322 may be removed in a region over the transistors (see FIG. 2B). Further alternatively, the conductive layer 326, the n-type semiconductor layer 323, the i-type semiconductor layer 322, and the p-type semiconductor layer 321 may be removed in a region over the transistors (see FIG. 2C). With any of the above structures, the amount of hydrogen diffused from the photodiode 320 to the transistor can be further reduced.

Figure 2B:
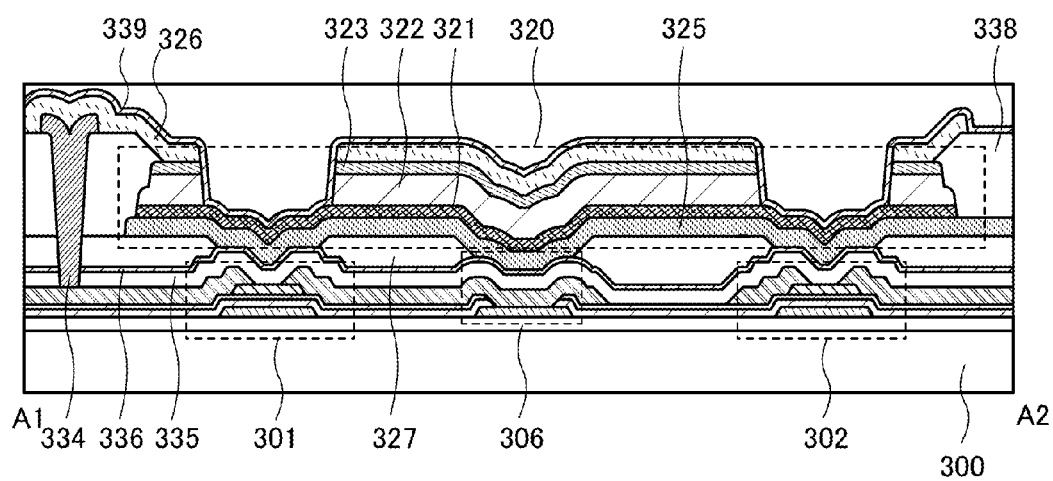
Figure 2C:
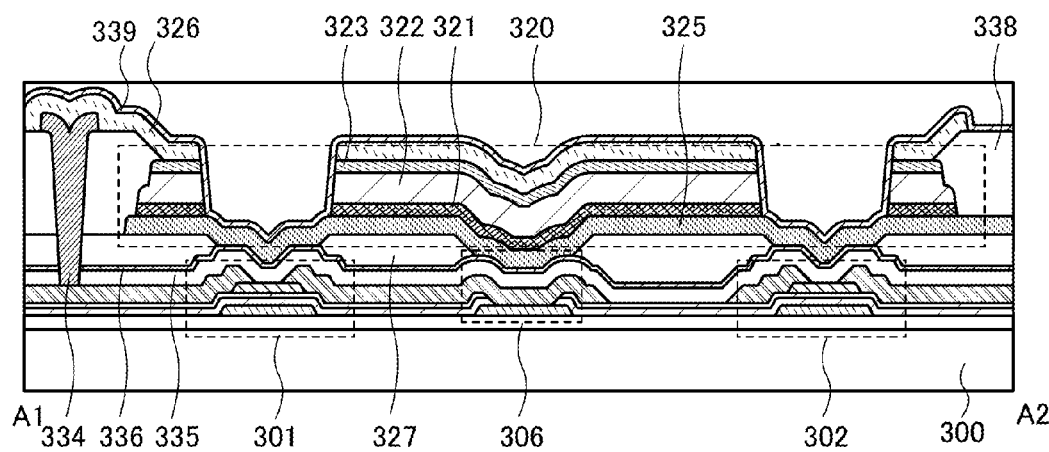

Note that the length of the region where the conductive layer 326 and the semiconductor layers are removed in FIGS. 2A to 2C is an example. The length of the region is preferably longer than the channel formation region, further preferably longer than the length of the semiconductor layers, still further preferably longer than the length of the first gate electrode layer.

Figure 3A:
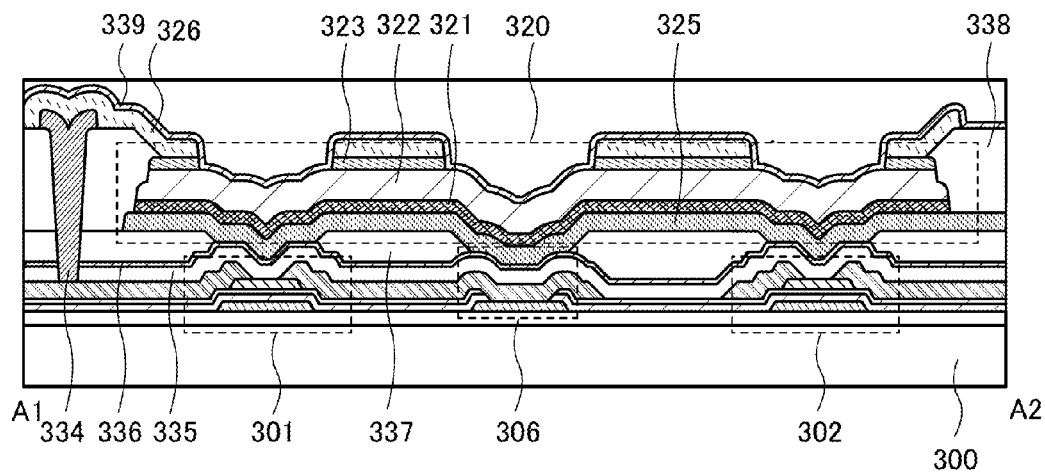
FIGS. 3A to 3C are cross sectional views each illustrating a pixel of an imaging device.
Figure 3B:
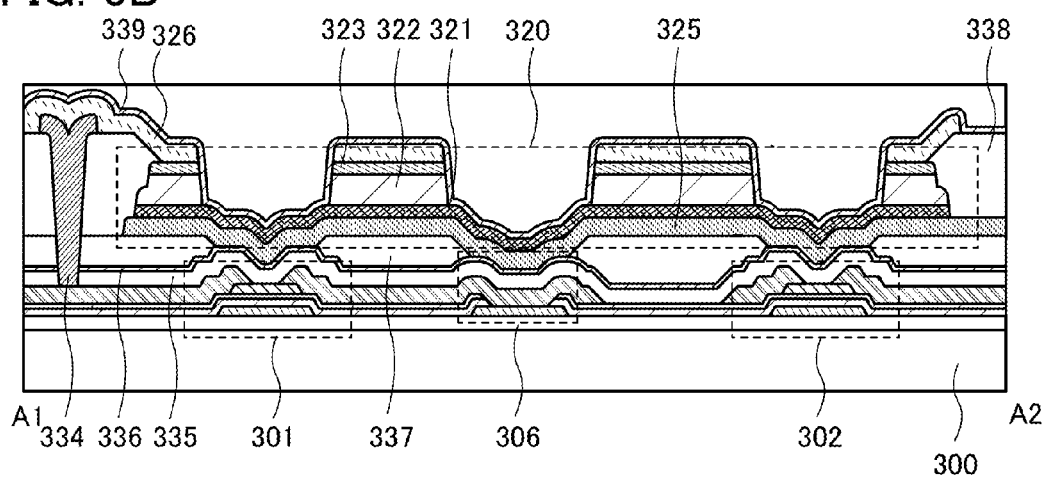
Figure 3C:
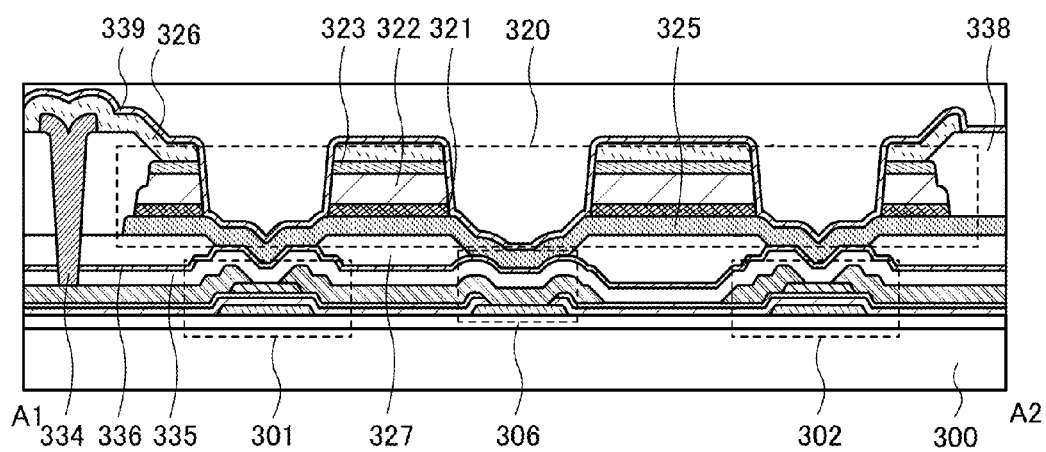

As shown in FIGS. 3A, 3B, and 3C, similarly to the above cases, part of the photodiode 320 may be removed also over the capacitor 306. With such a structure, leakage current between the anode electrode and the cathode electrode can be reduced.

A connection configuration of the components included in the pixel of the above-described imaging device is described with reference to the circuit diagram in FIG. 1B.

One of a source electrode and a drain electrode of the transistor 301 is connected to the cathode electrode of the photodiode 320. The other of the source electrode and the drain electrode of the transistor 301 is connected to a first gate electrode of the transistor 302. One of a source electrode and a drain electrode of the transistor 302 is connected to one of a source electrode and a drain electrode of the transistor 303. One of a source electrode and a drain electrode of the transistor 304 is connected to the other of the source electrode and the drain electrode of the transistor 301. One electrode of the capacitor 306 is connected to the other of the source electrode and the drain electrode of the transistor 301. The second gate electrode of each of the transistors 301, 302, 303, and 304 is connected to the anode electrode of the photodiode 320. The other electrode of the capacitor 306 is connected to the anode electrode of the photodiode 320. Note that all the above connections are electrical connections.

With the above configuration, the pixel circuit of the imaging device of one embodiment of the present invention can reduce the number of signal lines for supplying a signal to the second gate electrode layer of each transistor and the number of capacitor lines for supplying a potential of the other electrode of the capacitor.

Figure 4A:
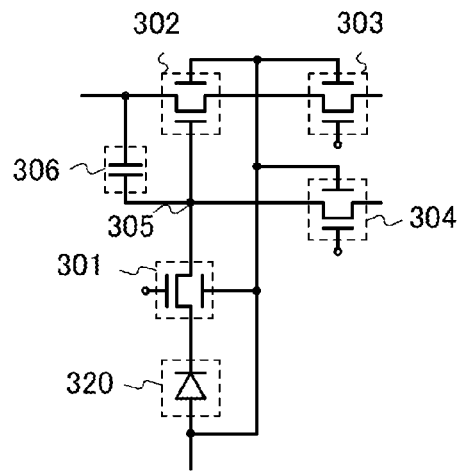
FIGS. 4A to 4F are circuit diagrams each illustrating a pixel of an imaging device.
Figure 4B:
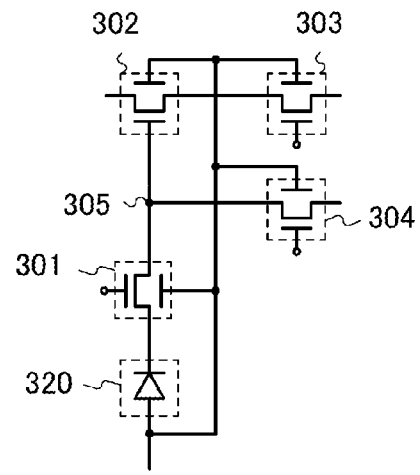
Figure 4C:
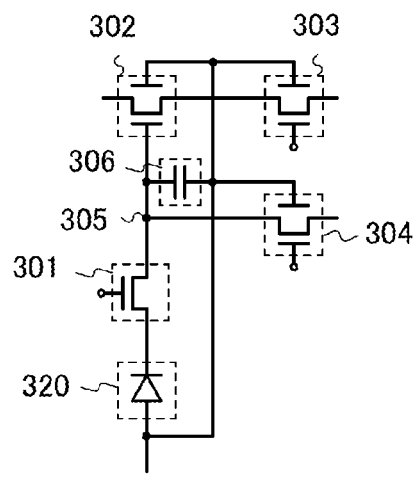
Figure 4D:
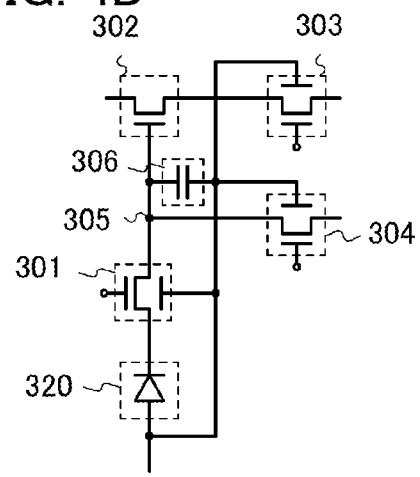
Figure 4E:
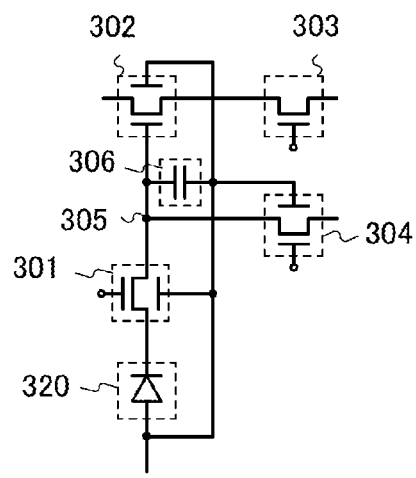
Figure 4F:
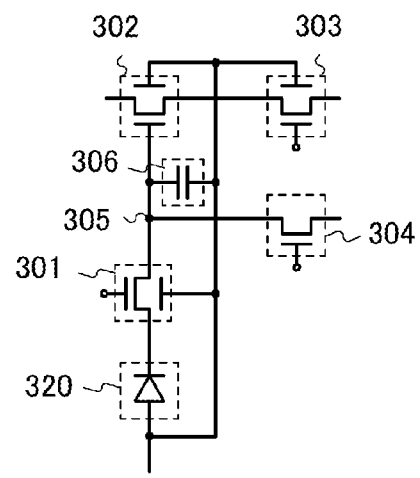

The pixel circuit of the imaging device of one embodiment of the present invention may have any of configurations shown in FIGS. 4A to 4F. FIG. 4A is a configuration in which the other electrode of the capacitor is connected to the other of the source electrode and the drain electrode of the transistor 302. FIG. 4B is a configuration without the capacitor 306. In FIGS. 4C to 4F, some of the transistors do not include the second gate electrode. Note that the circuit configurations in FIGS. 4A to 4F can be arbitrarily combined.

Here, the transistor 301 can function as a transfer transistor for controlling the potential of a charge storage portion 305 (FD) in response to output of the photodiode 320. The transistor 302 can function as an amplifying transistor for outputting a signal corresponding to the potential of the charge storage portion 305 (FD). The transistor 303 can function as a selection transistor for selecting a pixel when the circuit serves as a pixel. The transistor 304 can function as a reset transistor for initializing the potential of the charge storage portion (FD) 305.

Figure 5:
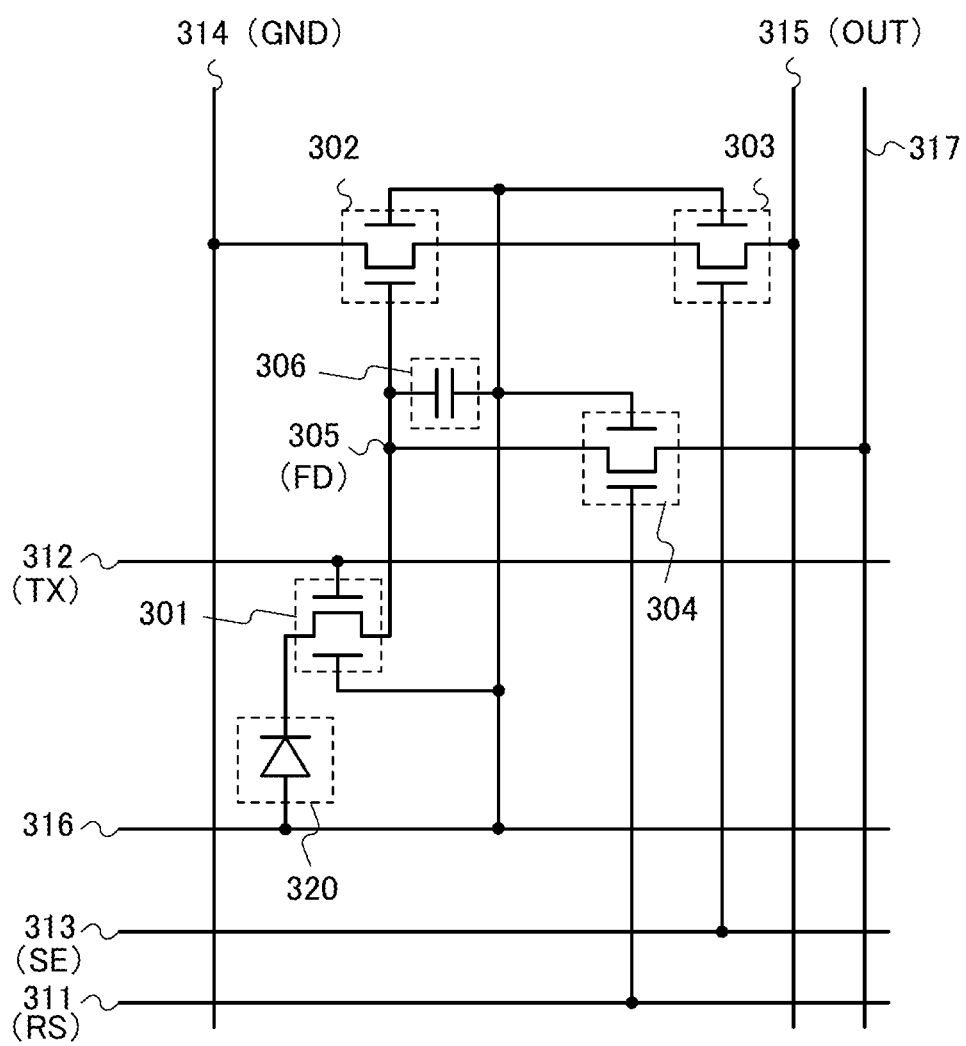
FIG. 5 is a circuit diagram of a pixel of an imaging device.

FIG. 5 illustrates a configuration in which signal lines are connected to the circuit in FIG. 1B. The anode of the photodiode 320 can be connected to a wiring 316. A gate electrode of the transistor 301 can be connected to a wiring 312 (TX). The other of the source electrode and the drain electrode of the transistor 302 can be connected to a wiring 314 (GND). The other of the source electrode and the drain electrode of the transistor 304 can be connected to a wiring 317, and a gate electrode thereof can be connected to a wiring 311 (RS). The other of the source electrode and the drain electrode of the transistor 303 can be connected to a wiring 315 (OUT), and a gate electrode thereof can be connected to a wiring 313 (SE). Note that all the above connections are electrical connections.

The wiring 311 (RS) can function as a signal line for controlling the transistor 304. The wiring 312 (TX) can function as a signal line for controlling the transistor 301. The wiring 313 (SE) can function as a signal line for controlling the transistor 303. The wiring 314 (GND) can function as a signal line for supplying a reference potential (e.g., GND). The wiring 315 (OUT) can function as a signal line for reading a signal output from the transistor 302. The wiring 316 functions as a signal line for outputting electric charge from the charge storage portion 305 (FD) through the photodiode 320 and is a low-potential (VSS) line in the circuit in FIG. 5. The wiring 317 functions as a signal line for resetting the potential of the charge storage portion (FD) and is a high-potential (VDD) line in the circuit in FIG. 5.

A potential such as GND, VSS, or VDD may be supplied to the wiring 314. Here, a potential or a voltage has a relative value. Therefore, the potential GND is not necessarily 0 V.

According to the operation method of the pixel circuit included in the configuration in FIG. 5, which is described in detail later; the photodiode 320 operates with application of a reverse bias. That is, a potential lower than the source potential of each transistor can be applied to the anode electrode of the photodiode 320. Thus, the same potential is applied to the second gate electrode of each transistor, and the threshold voltage of the transistor can be shifted in the positive direction.

Figure 6A:
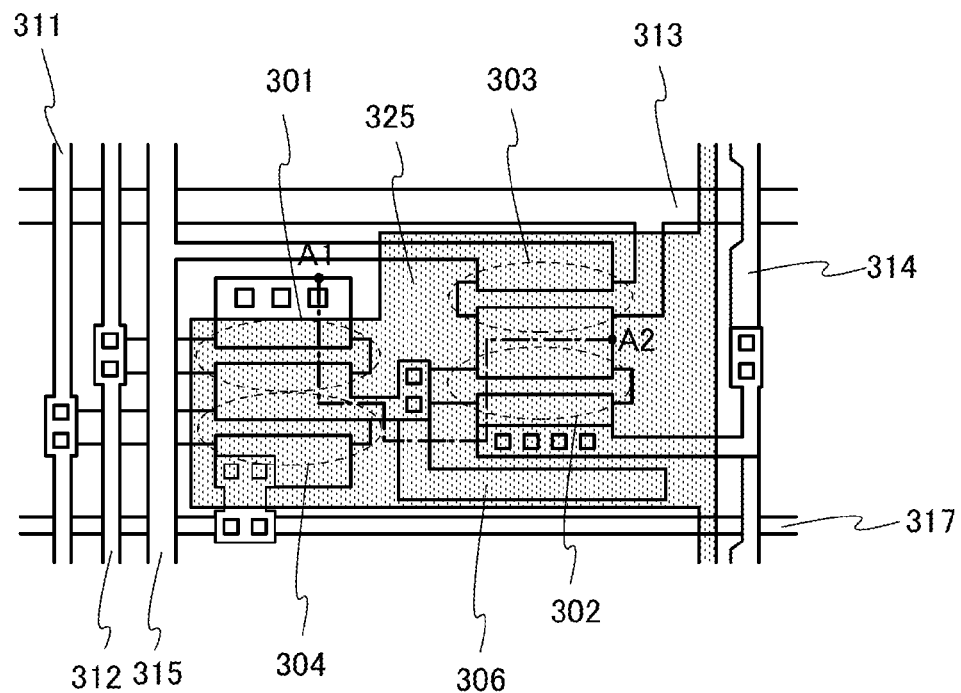
FIGS. 6A and 6B are top views of pixels of imaging devices.
Figure 6B:
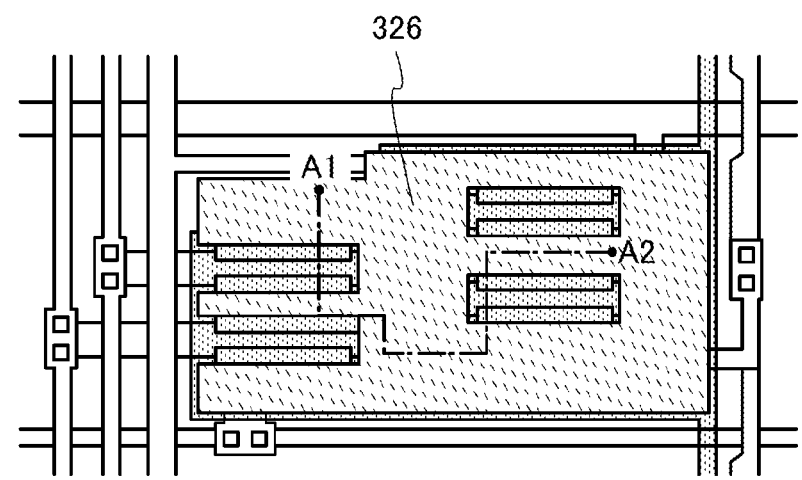

FIG. 6A is a top view of the pixel of the imaging device having the circuit configuration shown in FIG. 5. The cross section along A1-A2 in FIG. 6A corresponds to the cross section in FIG. 1A. FIG. 6B is a top view of any of the pixels of the imaging devices shown in FIGS. 2A to 2C. Note that for simplification of the drawing, some components are not illustrated in FIGS. 6A and 6B.

As described above, the transistors and the photodiode overlap with each other, whereby the density of the pixels can be increased and a high-definition image can be obtained. Furthermore, although characteristics of a transistor including an oxide semiconductor deteriorates due to light irradiation in some cases, the semiconductor layers of the photodiode 320 and/or the conductive layer 325 serve (serves) as a light-blocking film, so that deterioration of the transistor can be suppressed.

FIGS. 7A to 7D each show an example of a cross sectional view of part of an imaging device in which any of the above-described pixels can be used. In FIGS. 7A to 7D, three adjacent pixels are denoted by a pixel 350a, a pixel 350b, and a pixel 350c.

Figure 7A:
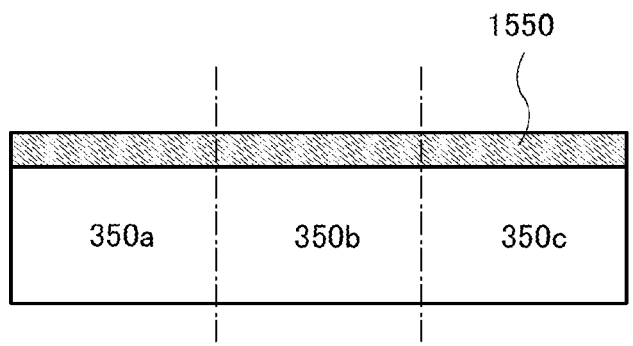
FIGS. 7A to 7D each illustrate a pixel of an imaging device.

The imaging device in FIG. 7A shows an example in which an optical conversion layer 1550 is formed over the pixels. For example, when a filter which blocks light having a wavelength shorter than or equal to that of visible light is used as the optical conversion layer 1550, an infrared imaging device can be obtained. When a filter which blocks light having a wavelength shorter than or equal to that of near-infrared light is used as the optical conversion layer 1550, a far-infrared imaging device can be obtained. When a filter which blocks light having a wavelength longer than or equal to that of visible light is used as the optical conversion layer 1550, an ultraviolet imaging device can be obtained. The structure can be applied not only to the imaging device but also to a detector which estimates light intensity in a specific wavelength.

When a scintillator is used as the optical conversion layer 1550, an imaging device which takes an image visualizing the intensity of radiation and is used for an X-ray imaging device, for example, can be obtained. Radiation such as X-rays passes through a subject to enter a scintillator, and then is converted into light (fluorescence) such as visible light or ultraviolet light owing to a phenomenon known as photoluminescence. Then, the photodiode 320 detects the light to obtain image data. The imaging device is also referred to as a flat panel detector. Furthermore, the imaging device having the structure may be used in a radiation detector or the like.

A scintillator includes a substance that, when irradiated with radial rays such as X-rays or gamma-rays, absorbs energy of the radial rays to emit visible light or ultraviolet light. The materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO dispersed in a resin or ceramics are exemplified.

Figure 7B:
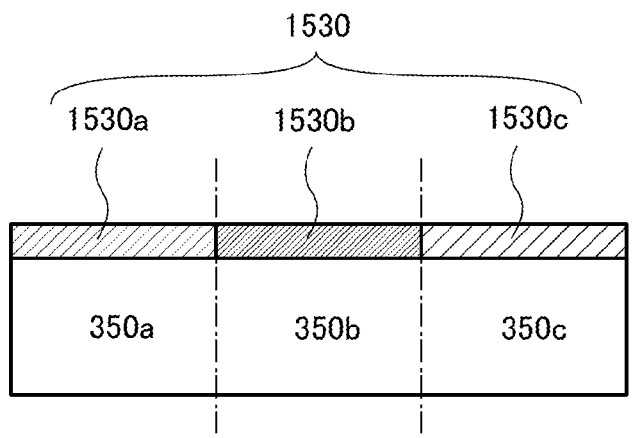

The imaging device in FIG. 7B shows an example in which a color filter 1530 is provided over the pixels. R (red), G (green), B (blue), Y (yellow), C (cyan), M (magenta), or the like is assigned to each of the color filters 1530a, 1530b, and 1530c; thus, a color image can be obtained.

Figure 7C:
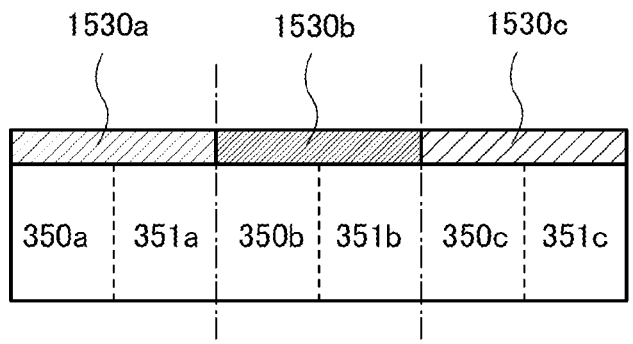

The imaging device in FIG. 7C has a structure in which pixels 351a, 351b, and 351c of a display device are adjacent to the pixels of the imaging device. The pixels of the display device each include a liquid crystal display element or an EL display element, a transistor connected to the liquid crystal display element or the EL display element, and the like. For example, the color filter 1530 is provided over the pixels of the imaging device and the display device as shown in FIG. 7C, whereby color display can be achieved, and a display panel with an image sensor with which a color image can be obtained can be formed.

Figure 7D:
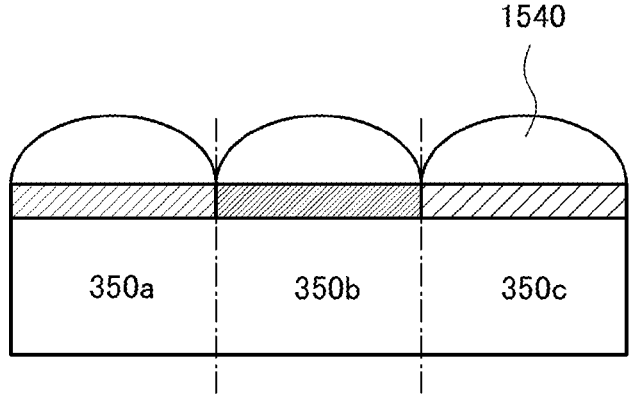

FIG. 7D shows an example in which a microlens array 1540 is provided over each of the pixels of the imaging device. The optical conversion layer 1550 or the color filter 1530 can be provided between the pixels and the microlens arrays. The use of the microlens array 1540 enables the photodiode 320 to be efficiently irradiated with light.

Note that an insulating film serving as a protective layer, a light-blocking layer which prevents entry of light into an adjacent pixel, an anti-reflective film, a planarization film, or the like may be provided between the pixels of the imaging device and the optical conversion layer 1550, the color filter 1530, or the microlens array 1540. Alternatively, a structure in which the optical conversion layer 1550, the color filter 1530, or the microlens array 1540 is not provided over each of the pixels may be employed.

Figure 8:
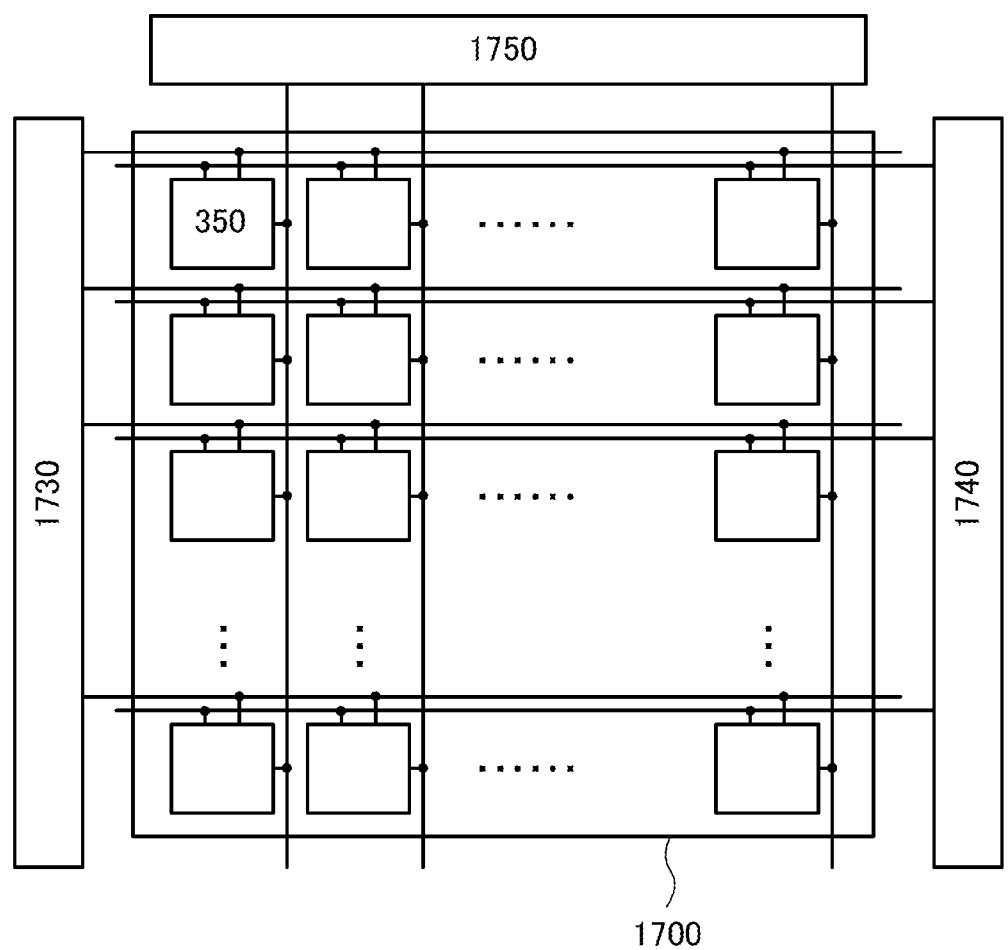
FIG. 8 illustrates a structure of an imaging device.

FIG. 8 is a schematic view illustrating a structure of an imaging device. The imaging device includes a plurality of pixels 350 each including the circuit shown in FIG. 1B, a pixel array 1700 on which the plurality of pixels 350 are arranged in a planar form, a circuit 1730, a circuit 1740, and a circuit 1750.

The circuits 1730 and 1740 are connected to the pixel array 1700. The circuit 1730 can function as a driver circuit of a reset transistor, for example. In this case, the circuit 1730 is electrically connected to the transistor 304 in FIG. 1B. The circuit 1740 can function as a driver circuit of a transfer transistor, for example. In this case, the circuit 1740 is electrically connected to the transistor 301 in FIG. 1B. Note that although the circuit 1730 and the circuit 1740 are separately provided in FIG. 8, the circuit 1730 and the circuit 1740 may be collectively arranged in one region.

A circuit 1750 is connected to the pixel array 1700. For example, the circuit 1750 can function as a driver circuit which selects a vertical output line which is to be electrically connected to the transistor 302.

Figure 9A:
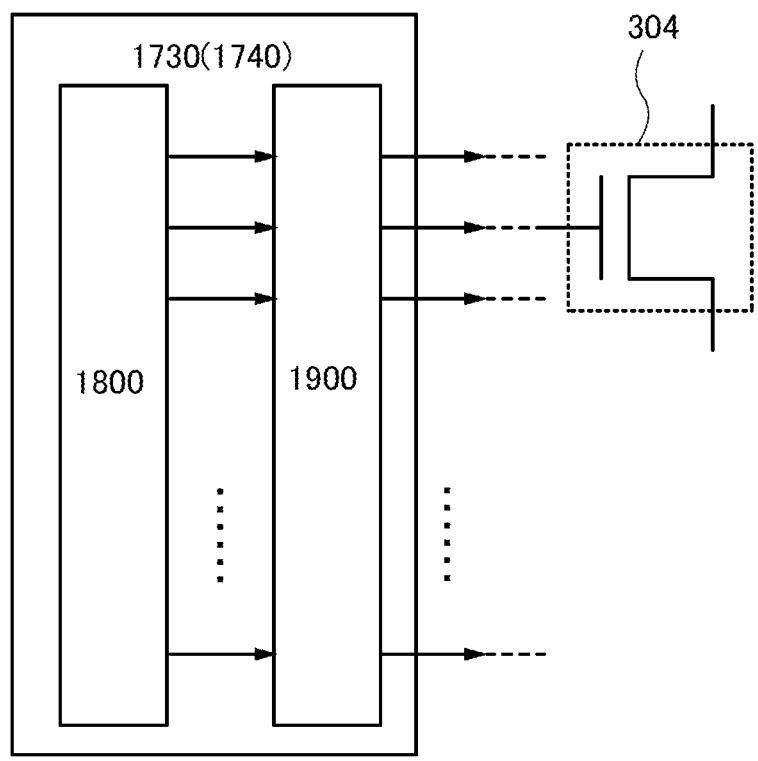
FIGS. 9A and 9B illustrate driver circuits of an imaging device.

The circuit 1730 and the circuit 1740 are each a driver circuit that outputs signals having binary values of high level and low level; therefore, their operations can be conducted with a combination of a shift register 1800 and a buffer circuit 1900 as illustrated in FIG. 9A.

Figure 9B:
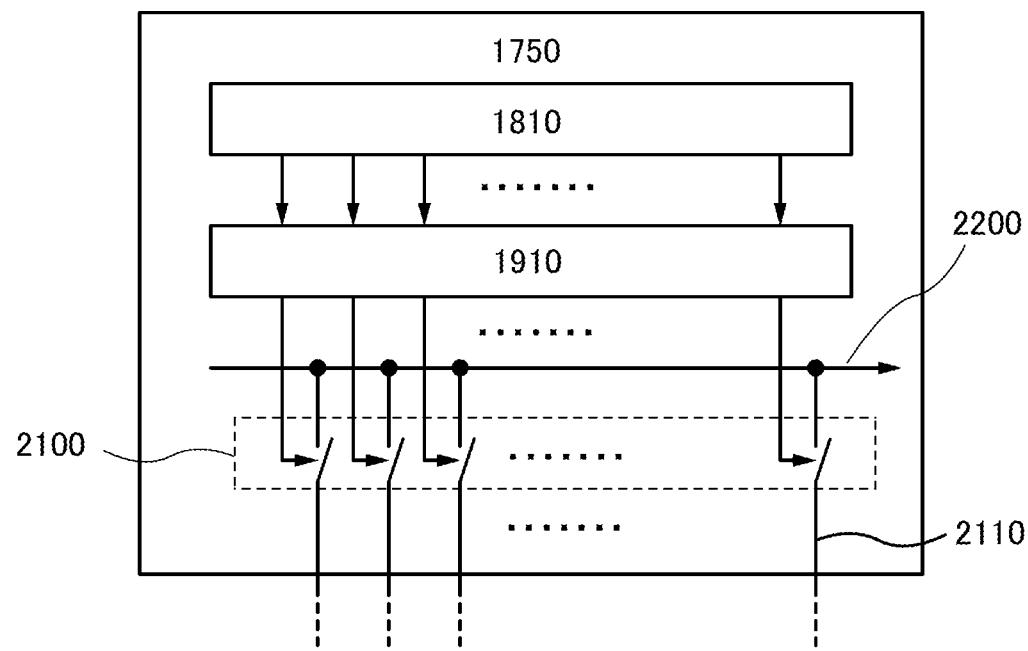

The circuit 1750 can include a shift register 1810, a buffer circuit 1910, and an analog switches 2100, as illustrated in FIG. 9B. Vertical output lines 2110 are selected by the analog switches 2100, and output signals are output to an output line 2200. The analog switches 2100 are sequentially selected by the shift register 1810 and the buffer circuit 1910.

Note that the circuits 1730, 1740, and 1750 may be formed over the same substrate as the pixel circuit, or may be included in an external IC chip.

In this Embodiment, an example in which one embodiment of the present invention is applied to an imaging device is described. However, the embodiment of the present invention is not limited thereto. The embodiment of the present invention may be applied to a semiconductor device with different function, for example.

This embodiment can be implemented in an appropriate combination with any of the structures described in the other embodiments.

Embodiment 2

In this embodiment, the detail of the pixel circuit shown in FIG. 5 in Embodiment 1 is described.

In the pixel circuit in FIG. 5, the photodiode 320 is a light-receiving element and generates current corresponding to the amount of light incident on the pixel circuit. The transistor 301 has a function of controlling supply of electric charge to the charge storage portion 305 (FD) from the photodiode 320. The transistor 302 has a function of outputting a signal which corresponds to the potential of the charge storage portion 305 (FD). The transistor 304 has a function of resetting the potential of the charge storage portion 305 (FD). The transistor 303 has a function of controlling selection of the pixel circuit at the time of reading.

Note that the charge storage portion 305 (FD) holds electric charge whose amount changes depending on the amount of light received by the photodiode 320.

Note that the transistor 302 and the transistor 303 only need to be connected in series between the wiring 315 and the wiring 314. Hence, the wiring 314, the transistor 302, the transistor 303, and the wiring 315 may be arranged in this order, or the wiring 314, the transistor 303, the transistor 302, and the wiring 315 may be arranged in this order.

Figure 11:
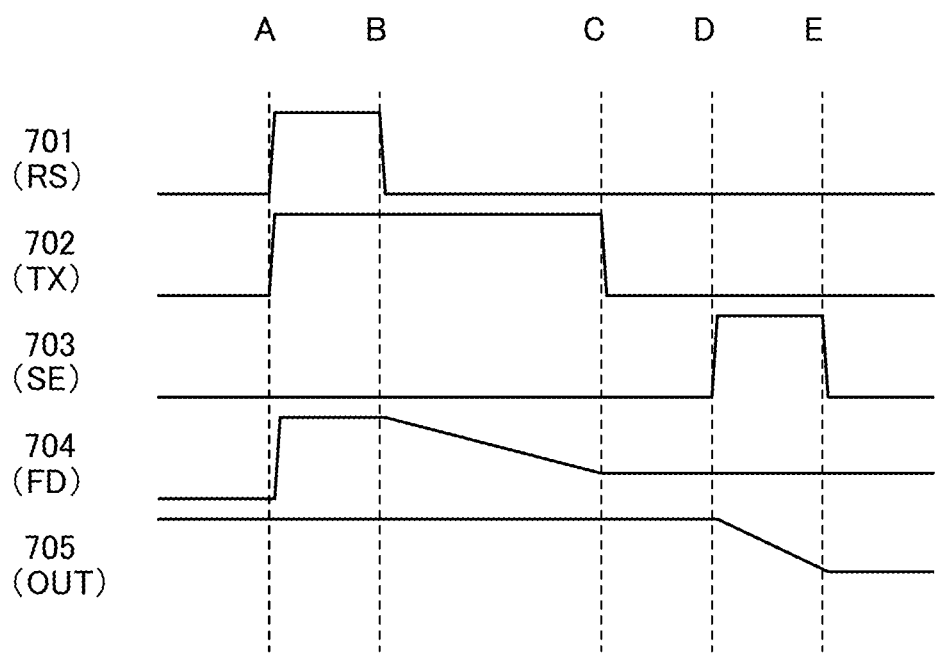
FIG. 11 is a timing chart showing an operation of a pixel circuit.

An example of the operation of the circuit in FIG. 5 is described using a timing chart shown in FIG. 11.

In FIG. 11, a potential of each wiring is denoted as a signal which varies between two levels for simplicity. Because each potential is an analog signal, the potential can, in practice, have various levels in accordance with situations without limitation on two levels. In the drawing, a signal 701 corresponds to the potential of the wiring 311 (RS); a signal 702, the potential of the wiring 312 (TX); a signal 703, the potential of the wiring 313 (SE); a signal 704, the potential of the charge storage portion 305 (FD); and a signal 705, the potential of the wiring 315 (OUT). The potential of the wiring 316 is always at low level, and the potential of the wiring 317 is always at high level.

At time A, the potential of the wiring 311 (RS) (the signal 701) is at high level and the potential of the wiring 312 (TX) (the signal 702) is at high level, so that the potential of the charge storage portion 305 (FD) (the signal 704) is initialized to the potential of the wiring 317 (high level), and reset operation is started. The potential of the wiring 315 (OUT) (signal 705) is precharged to high level.

At time B, the potential of the wiring 311 (RS) (signal 701) is set at low level, whereby the reset operation is completed to start accumulation operation. Here, a reverse bias is applied to the photodiode 320, whereby the potential of the charge storage portion 305 (FD) (signal 704) starts to decrease due to a reverse current. Since irradiation of the photodiode 320 with light increases the reverse current, the rate of decrease in the potential of the charge storage portion 305 (FD) (signal 704) changes depending on the amount of the light irradiation. In other words, channel resistance between the source and the drain of the transistor 302 changes depending on the amount of light emitted to the photodiode 320.

At time C, the potential of the wiring 312 (TX) (signal 702) is set to low level to complete the accumulation operation, so that the potential of the charge storage portion 305 (FD) (signal 704) becomes constant. Here, the potential is determined by the electric charges generated by the photodiode 320 during the accumulation operation. That is, the potential changes depending on the amount of light emitted to the photodiode 320. Furthermore, since the transistor 301 and the transistor 304 are each a transistor which includes a channel formation region formed of an oxide semiconductor layer and which has an extremely low off-state current, the potential of the charge storage portion 305 (FD) can be kept constant until the reset operation is performed again.

Note that when the potential of the wiring 312 (TX) (signal 702) is set at low level, the potential of the charge storage portion 305 (FD) might change owing to parasitic capacitance between the wiring 312 (TX) and the charge storage portion (FD). In the case where this potential change is large, the electric charges generated by the photodiode 320 during the accumulation operation cannot be obtained accurately. Examples of effective methods to reduce the change in the potential include reducing the capacitance between the gate and the source (or between the gate and the drain) of the transistor 301, increasing the gate capacitance of the transistor 302, and providing a storage capacitor in the charge storage portion 305 (FD). Note that in this embodiment, explanation is provided ignoring the change in the potential.

At time D, the potential of the wiring 313 (SE) (signal 703) is set at high level to turn on the transistor 303, whereby selection operation starts and the wiring 314 (GND) and the wiring 315 (OUT) are electrically connected to each other through the transistor 302 and the transistor 303. The potential of the wiring 315 (OUT) (signal 705) starts to decrease because the precharge of the wiring 315 (OUT) is completed before time D. Here, the rate at which the potential of the wiring 315 (OUT) (signal 705) decreases depends on the current between the source and the drain of the transistor 302. That is, the rate of decrease changes depending on the amount of light emitted to the photodiode 320 during the accumulation operation.

At time E, the potential of the wiring 313 (SE) (signal 703) is set at low level to turn off the transistor 303, so that the selection operation is completed and the potential of the wiring 315 (SE) (signal 705) becomes a constant value. Here, the constant value depends on the amount of light emitted to the photodiode 320. Therefore, the amount of light emitted to the photodiode 320 during the accumulation operation can be known by obtaining the potential of the wiring 315 (SE).

Specifically, when the photodiode 320 is irradiated with light with high intensity, the potential of the charge storage portion 305 (FD), that is, the gate voltage of the transistor 302 is low. Therefore, current flowing between the source and the drain of the transistor 302 becomes small; as a result, the potential of the wiring 315 (OUT) (signal 705) is gradually lowered. Thus, a relatively high potential can be read from the wiring 315 (OUT).

In contrast, when the photodiode 320 is irradiated with light with low intensity, the potential of the charge storage portion 305 (FD), that is, the gate voltage of the transistor 302 is high. Therefore, the current flowing between the source and the drain of the transistor 302 becomes large; thus, the potential of the wiring 315 (OUT) (signal 705) rapidly decreases. Thus, a relatively low potential can be read from the wiring 315 (OUT).

Note that the threshold voltage of each transistor can be shifted in the positive direction by supplying a potential of, for example, about −10 V to −1 V to the wiring 316. Thus, the threshold voltage of the transistor that is shifted in the negative direction at an early stage or shifted over time due to stress can be corrected.

Figure 12:
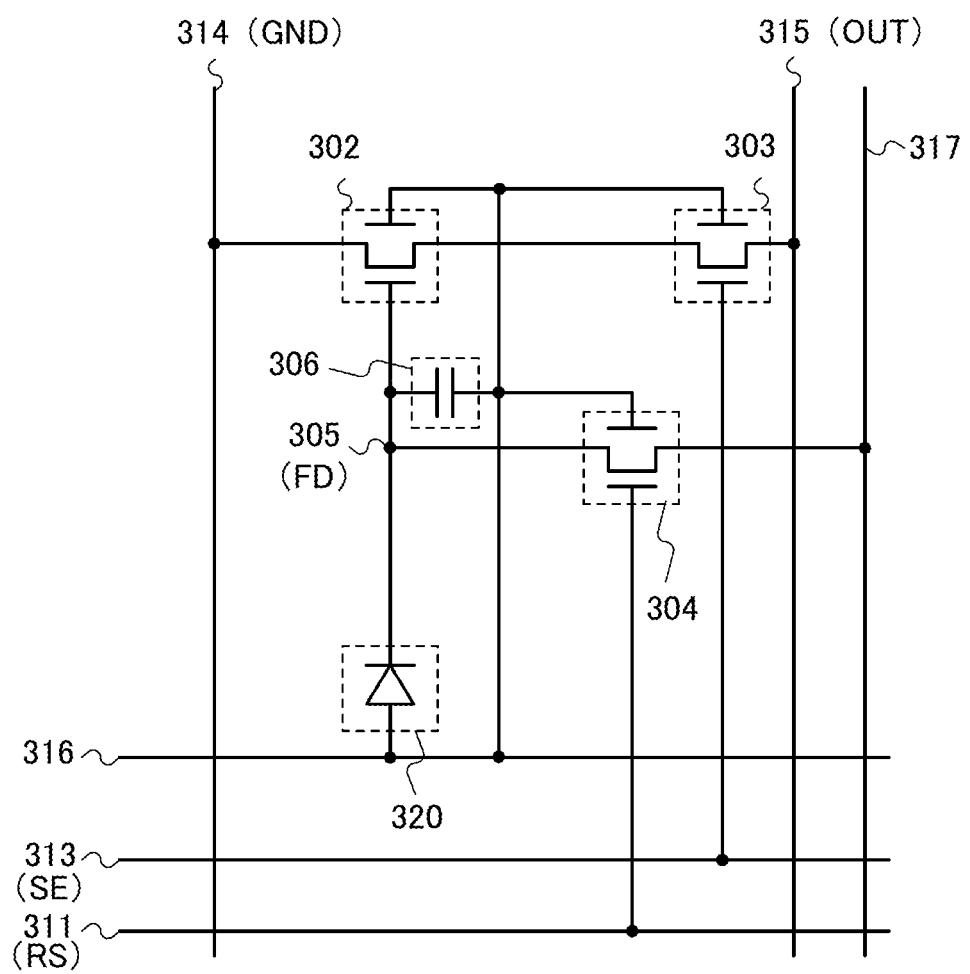
FIG. 12 is a circuit diagram of a pixel of an imaging device.

FIG. 5 shows, but is not limited to, an example including the transistor 301. The transistor 301 can be omitted as shown in FIG. 12.

Figure 13A:
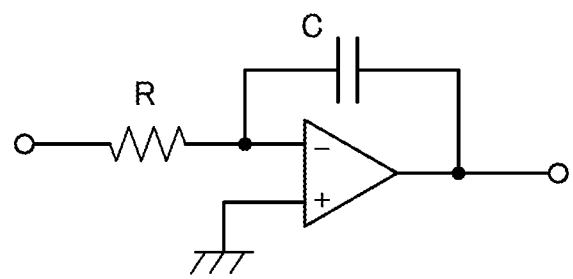
FIGS. 13A to 13C each illustrate an integrator circuit.
Figure 13B:
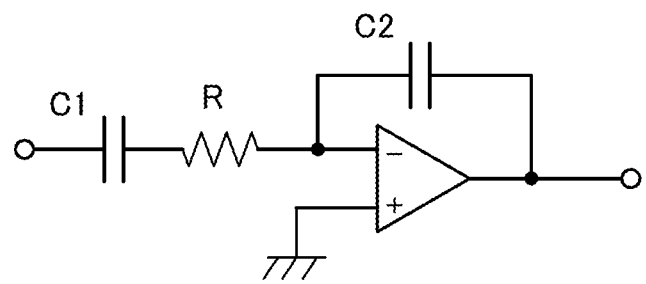
Figure 13C:
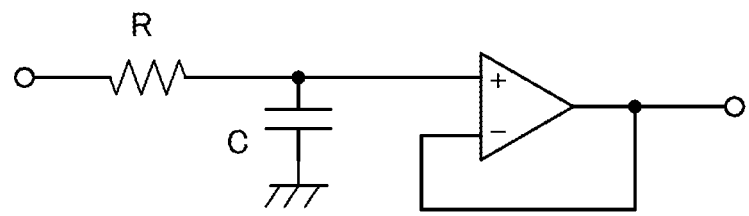

In the circuit example, an integrator circuit illustrated in FIG. 13A, 13B, or 13C may be connected to the wiring 315 (OUT). In such a circuit, an S/N ratio of a reading signal can be increased to sense weaker light; that is, the sensitivity of the imaging device can be increased.

FIG. 13A illustrates an integrator circuit using an operational amplifier circuit (also referred to as an op-amp). An inverting input terminal of the operational amplifier circuit is connected to the wiring 315 (OUT) through a resistor R. A non-inverting input terminal of the operational amplifier circuit is grounded. An output terminal of the operational amplifier circuit is connected to the inverting input terminal of the operational amplifier circuit through a capacitor C.

FIG. 13B illustrates an integrator circuit including an operational amplifier circuit having a structure different from that in FIG. 13A. The inverting input terminal of the operational amplifier circuit is connected to the wiring 315 (OUT) through a resistor R and a capacitor C1. A non-inverting input terminal of the operational amplifier circuit is grounded. An output terminal of the operational amplifier circuit is connected to the inverting input terminal of the operational amplifier circuit through a capacitor C2.

FIG. 13C illustrates an integrator circuit using an operational amplifier circuit having a structure different from those in FIGS. 13A and 13B. The non-inverting input terminal of the operational amplifier circuit is connected to the wiring 315 (OUT) through the resistor R. An output terminal of the operational amplifier circuit is connected to the inverting input terminal of the operational amplifier circuit. The resistor R and the capacitor C constitute a CR integrator circuit. The operational amplifier circuit is a unity gain buffer.

This embodiment can be implemented in an appropriate combination with any of the structures described in the other embodiments.

Embodiment 3

In this embodiment, an example of a driving method of a pixel circuit is described.

As described in Embodiment 2, the operation of the pixel circuit is repetition of the reset operation, the accumulation operation, and the selection operation. As imaging modes in which the whole pixel matrix is controlled, a global shutter system and a rolling shutter system are known.

Figure 14A:
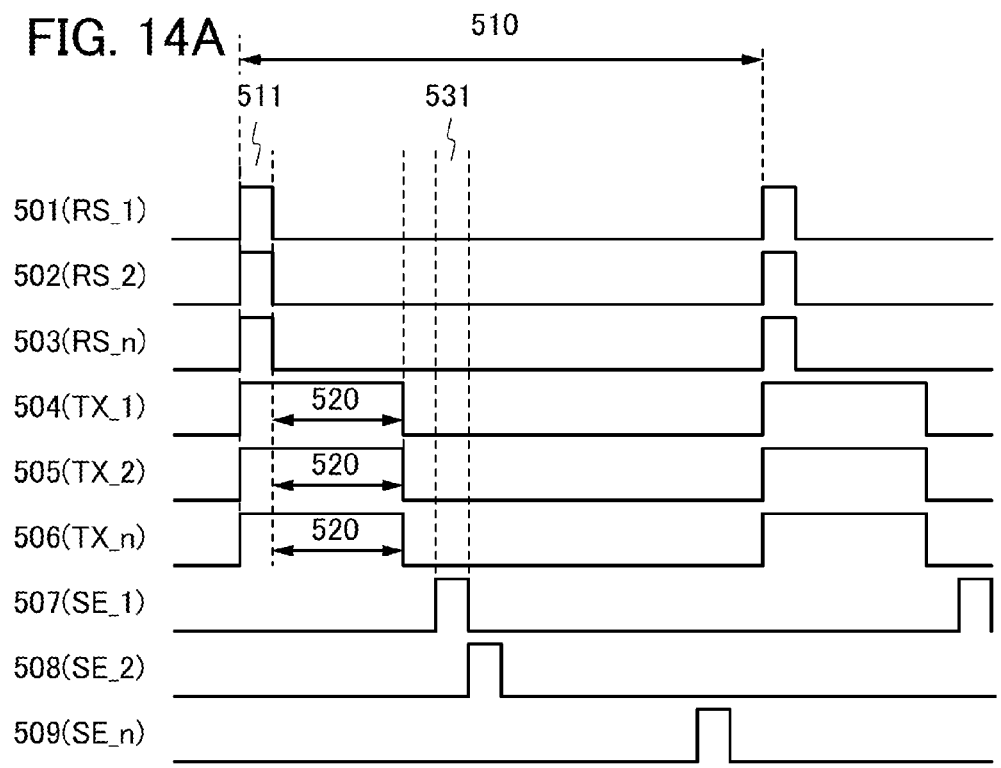
FIGS. 14A and 14B are timing charts illustrating operations in a global shutter system and a rolling shutter system, respectively.

FIG. 14A shows a timing chart in a global shutter system. FIG. 14A shows operations of an imaging device in which a plurality of pixel circuits illustrated in FIG. 5 are arranged in a matrix. Specifically, FIG. 14A show operations of the pixel circuits from the first row to the n-th row (n is a natural number of three or more).

In FIG. 14A, a signal 501, a signal 502, and a signal 503 are input to the wirings 311 (RS) connected to the pixel circuits in the first row, the second row, and the n-th row, respectively. A signal 504, a signal 505, and a signal 506 are input to the wirings 312 (TX) connected to the pixel circuits in the first row, the second row, and the n-th row, respectively. A signal 507, a signal 508, and a signal 509 are input to the wirings 313 (SE) connected to the pixel circuits in the first row, the second row, and the n-th row, respectively.

A period 510 is a period required for one imaging. In a period 511, the pixel circuits in each row perform the reset operation at the same time. In a period 520, the pixel circuits in each row perform the accumulation operation at the same time. The selection operation is sequentially performed in the pixel circuits for each row. For example, in a period 531, the selection operation is performed in the pixel circuits in the first row. As described above, in the global shutter system, the reset operation is performed in all the pixel circuits substantially at the same time, the accumulation operation is performed in all the pixel circuits substantially at the same time, and then the read operation is sequentially performed for each row.

That is, in the global shutter system, since the accumulation operation is performed in all the pixel circuits substantially at the same time, imaging is simultaneously performed in the pixel circuits in all the rows. Therefore, an image with little distortion can be obtained even in capturing a moving object.

Figure 14B:
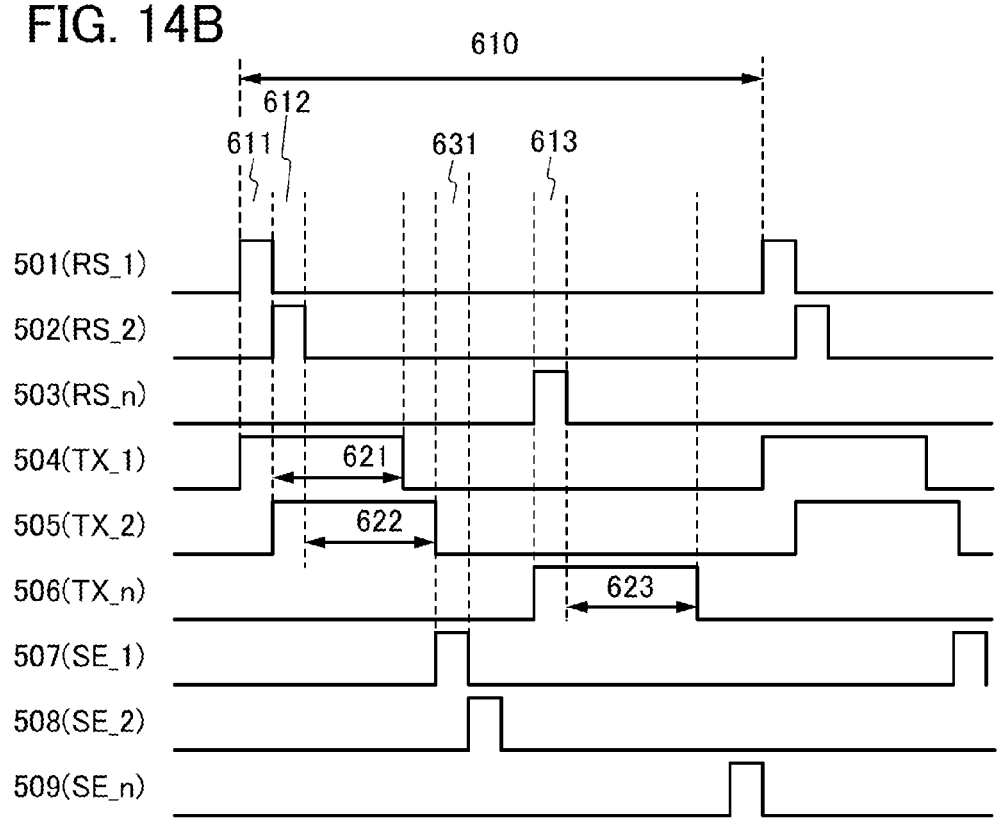

FIG. 14B is a timing chart of the case where a rolling shutter system is used. The description of FIG. 14A can be referred to for the signals 501 to 509. A period 610 is a period required for one imaging. A period 610 is the time taken for one imaging. A period 611, a period 612, and a period 613 are reset periods in the first row, the second row, and the n-th row, respectively. A period 621, a period 622, and a period 623 are accumulation operation periods in the first row, the second row, and the n-th row, respectively. In a period 631, the selection operation is performed in the pixel circuits in the first row. As described above, in the rolling shutter system, the accumulation operation is not performed at the same time in all the pixel circuits but is sequentially performed for each row; thus, imaging is not simultaneously performed in the pixel circuits in all the rows. Therefore, the timing of imaging in the first row is different from that of imaging in the last row, and thus an image with large distortion is obtained in capturing a moving object.

To perform the global shutter system, the potential of the charge storage portion (FD) in each pixel circuit needs to be kept until sequential reading of signals from the pixels is completed. When a transistor including a channel formation region formed of an oxide semiconductor and having an extremely low off-state current is used as the transistor 301 and the like, the potential of the charge storage portion (FD) can be kept for a long time. In the case where a transistor including a channel formation region formed of silicon or the like is used as the transistor 301 and so on, the potential of the charge storage portion (FD) cannot be kept for a long time because of a high off-state current, which makes it difficult to use the global shutter system.

As described above, the use of the transistor in which a channel formation region is formed of an oxide semiconductor for the pixel circuits makes it easy to perform the global shutter system.

This embodiment can be implemented in an appropriate combination with any of the structures described in the other embodiments.

Embodiment 4

In this embodiment, a transistor that can be used for an imaging device of one embodiment of the present invention and a material included in the transistor will be described. In the drawings in this embodiment, some components are enlarged, reduced in size, or omitted for easy understanding.

Figure 15A:
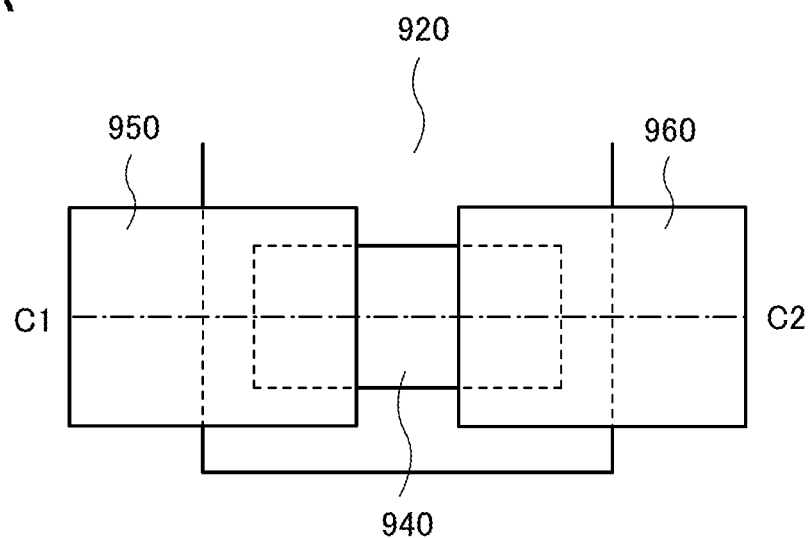
FIGS. 15A and 15B are a top view and a cross-sectional view of a transistor.
Figure 15B:
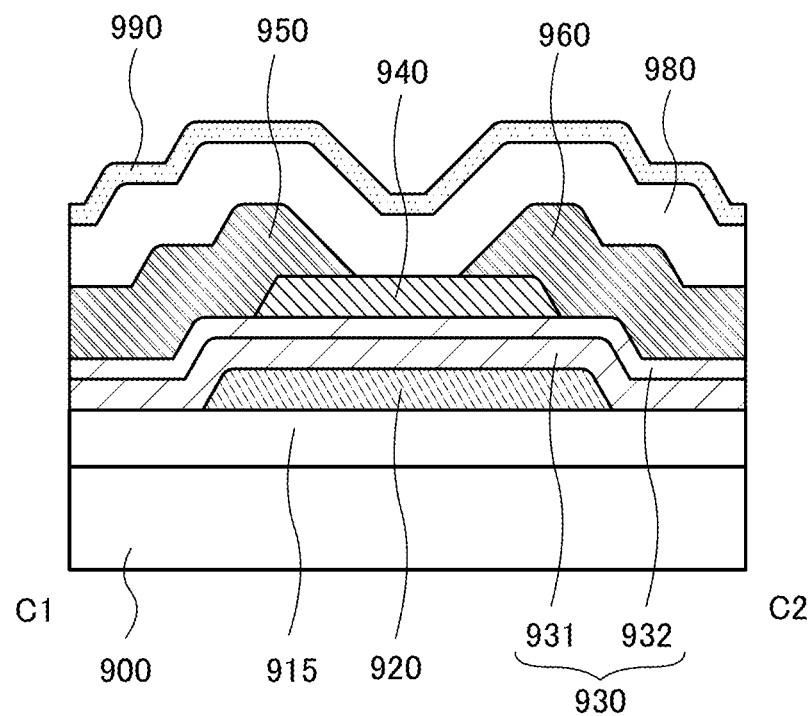

FIGS. 15A and 15B show a top view and a cross-sectional view of the transistor which can be used in the imaging device of one embodiment of the present invention. FIG. 15A is a top view and FIG. 15B is a cross section taken along dashed-dotted C1-C2 in FIG. 15A. The direction of the dashed-dotted line C1-C2 is referred to as a channel length direction, and the direction perpendicular to the channel length direction is referred to as a channel width direction.

The transistor includes an insulating layer 915 over a substrate 900, a gate electrode layer 920, a gate insulating film 930 in which an insulating layer 931 and an insulating layer 932 are stacked in this order, an oxide semiconductor layer 940, and a source electrode layer 950 and a drain electrode layer 960 which are in contact with part of the oxide semiconductor layer 940. An insulating layer 980 and an insulating layer 990 may be formed over the above-described structure.

Although the gate insulating film 930 is a stack of two layers in the above structure, it may be a single layer.

In one embodiment of the present invention, the insulating layer 980 and the insulating layer 990 can serve as a second gate insulating film. Furthermore, the insulating layer 990 can be formed using a material serving as the hydrogen barrier film described in Embodiment 1.

Figure 16A:
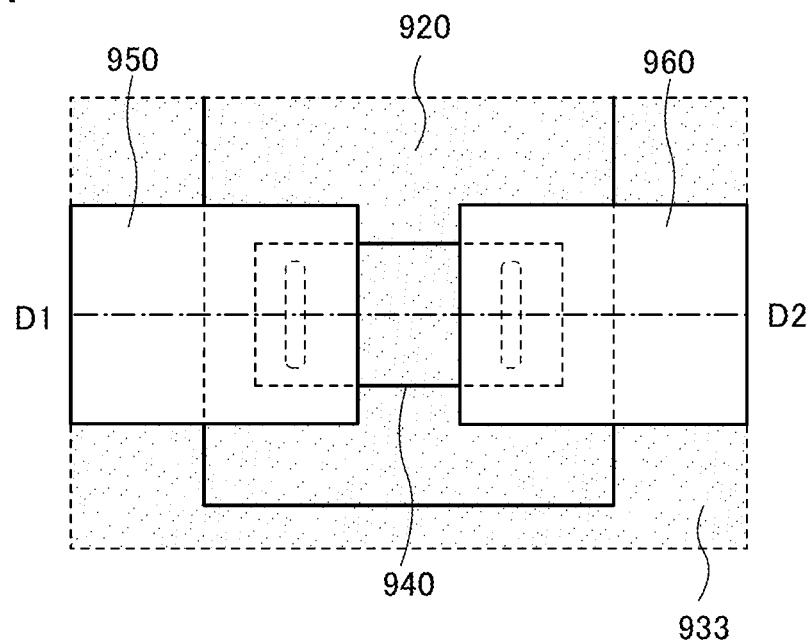
FIGS. 16A and 16B are a top view and a cross-sectional view of a transistor.
Figure 16B:
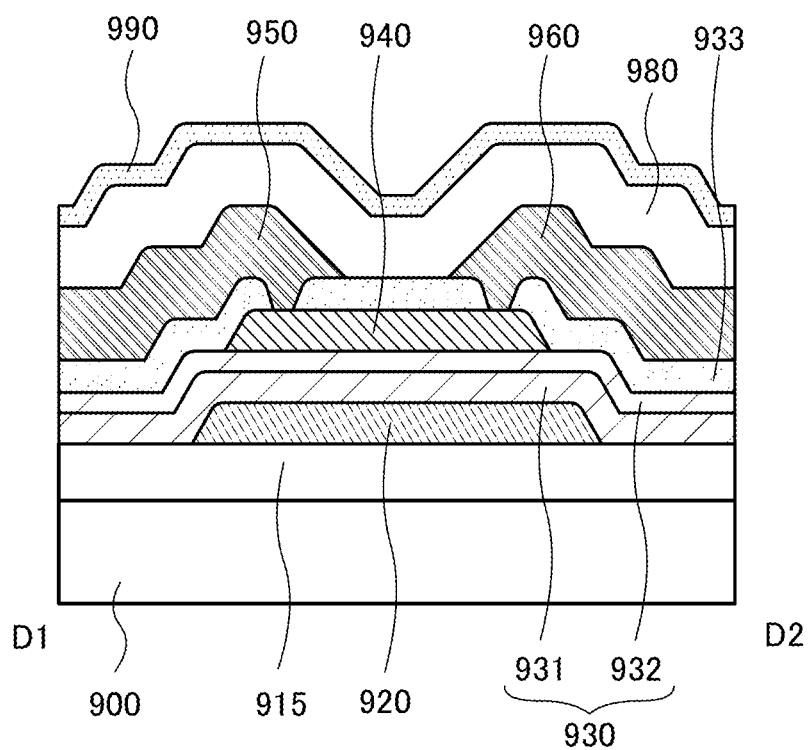

The transistor that can be used for the imaging device of one embodiment of the present invention may have a channel-protective bottom-gate structure as illustrated in FIGS. 16A and 16B. FIG. 16A is a top view, and FIG. 16B is a cross section taken along dashed-dotted line D1-D2 in FIG. 16A. The direction of the dashed-dotted line D1-D2 is referred to as a channel length direction, and the direction perpendicular to the channel length direction is referred to as a channel width direction, In this structure, an insulating layer 933 has a function of protecting a channel region. Thus, the insulating layer 933 may be provided only in a region overlapping with the channel region or provided in not only the region overlapping with the channel region but also a region other than the region as illustrated in FIGS. 16A and 16B.

Figure 17A:
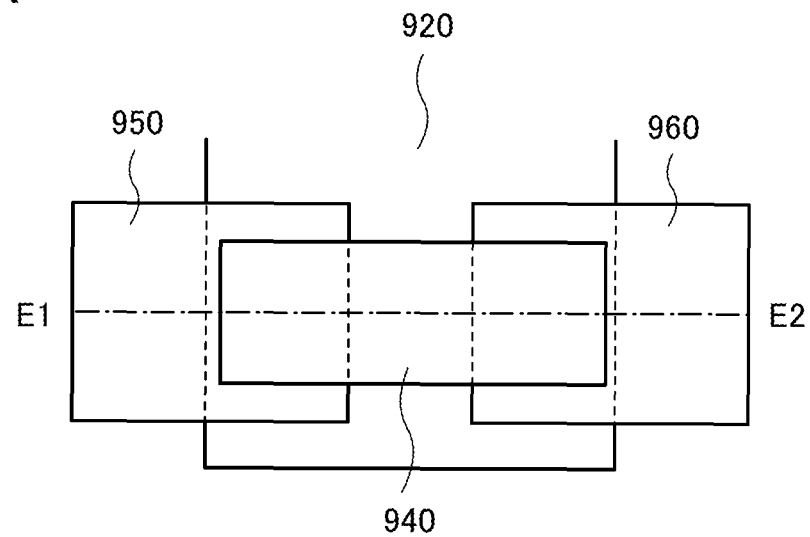
FIGS. 17A and 17B are a top view and a cross-sectional view of a transistor.
Figure 17B:
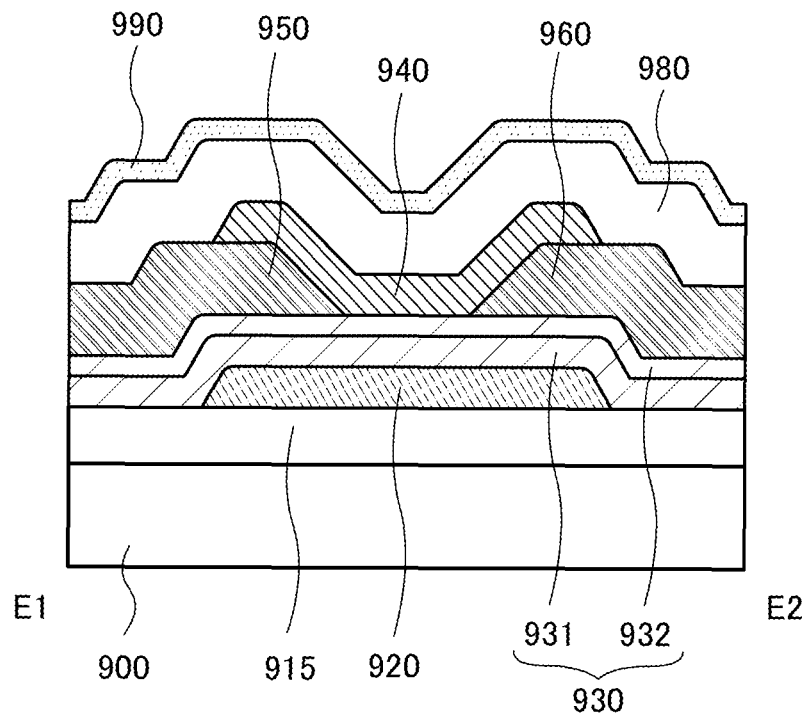

The transistor that can be used for the imaging device of one embodiment of the present invention may have a bottom-contact bottom-gate structure as shown in FIGS. 17A and 17B. FIG. 17A is a top view and FIG. 17B is a cross section taken along dashed-dotted line E1-E2 in FIG. 17A. The direction of the dashed-dotted line E1-E2 is referred to as a channel length direction, and the direction perpendicular to the channel length direction is referred to as a channel width direction.

In the transistor that can be used in the imaging device of one embodiment of the present invention, an oxide semiconductor can be used for an active layer. The transistor using an oxide semiconductor layer has a higher mobility than a transistor using amorphous silicon, and is thus easily reduced in size, resulting in a reduction in the size of a pixel. Note that an embodiment of the present invention is not limited thereto. An active layer may include a semiconductor other than an oxide semiconductor depending on the case or condition.

Note that in each of the transistors in FIGS. 15A and 15B and FIGS. 16A and 16B, the length of the gate electrode layer 920 in the channel length direction is preferably larger than that of the oxide semiconductor layer 940. When the imaging device of one embodiment of the present invention is combined with, for example, a display device having a backlight, the gate electrode layer serves as a light-blocking layer, and a deterioration of electrical characteristics, caused by irradiation of the oxide semiconductor layer 940 with light, can be suppressed.

Figure 18A:
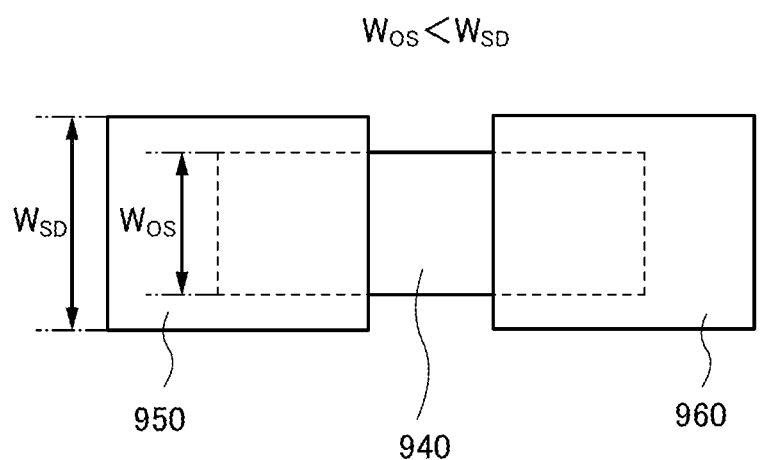
FIGS. 18A and 18B are top views each illustrating a transistor.
Figure 18B:
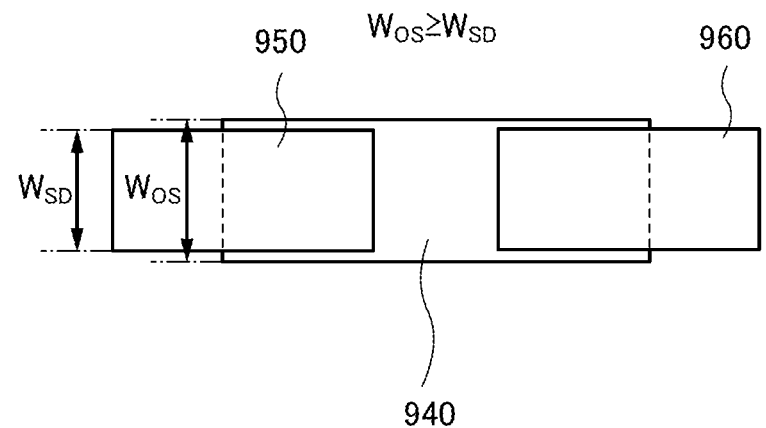

The source electrode layer 950 and the drain electrode layer 960 of the transistor can have a structure as illustrated in top-views of FIGS. 18A and 18B. FIGS. 18A and 18B each illustrate only the oxide semiconductor layer 940, the source electrode layer 950, and the drain electrode layer 960. As illustrated in FIG. 18A, the width ($W_{SD}$) of each of the source electrode layer 950 and the drain electrode layer 960 may be larger than the width ($W_{OS}$) of the oxide semiconductor layer 940. Alternatively, as illustrated in FIG. 18B, $W_{SD}$ may be smaller than $W_{OS}$. When $W_{OS} \geq W_{SD}$ ($W_{SD}$ is less than or equal to $W_{OS}$) is satisfied, a gate electric field is easily applied to the entire oxide semiconductor layer 940, so that electrical characteristics of the transistor can be improved.

Next, the components of the transistor of one embodiment of the present invention will be described in detail.

As the substrate 900, a glass substrate, a ceramic substrate, a quartz substrate, a sapphire substrate, or the like can be used. Alternatively, a single crystal semiconductor substrate or a polycrystalline semiconductor substrate of silicon or silicon carbide, a compound semiconductor substrate of silicon germanium, a silicon-on-insulator (SOI) substrate, or the like can be used.

As the insulating layer 915, for example, a single layer such as a silicon oxide film, a silicon oxynitride film, a silicon nitride film, or a silicon nitride oxide film, or a stacked film including any of the above films can be used. The insulating layer 915 may be omitted so that the gate electrode layer 920 is in direct contact with the substrate 900.

The gate electrode layer 920 can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co), an alloy including the above metal element, an alloy in which any of the above metal elements are combined, or the like. Furthermore, the gate electrode layer 920 may have a single-layer structure or a stacked structure of two or more layers.

Alternatively, the gate electrode layer 920 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, or graphene. It is also possible to have a stacked structure formed using the above light-transmitting conductive material and the above metal element.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode layer 920 and the insulating layer 931.

As the insulating layers 931 and 932, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Instead of a stacked structure of the insulating layers 931 and 932, the gate insulating film 930 may be an insulating film of a single layer formed using a material selected from the above or an insulating film of three or more layers. The insulating layer 980 can also be formed using any of the above materials.

The insulating layer 932 that is in contact with the oxide semiconductor layer 940 functioning as a channel formation region of the transistor is preferably an oxide insulating film and preferably has a region (oxygen-excess region) containing oxygen in excess of the stoichiometric composition. In other words, the insulating layer 932 is an insulating film from which oxygen can be released. In order to provide the oxygen-excess region in the insulating layer 932, the insulating layer 932 is formed in an oxygen atmosphere, for example. Alternatively, oxygen may be introduced into the deposited insulating layer 932 to provide the oxygen-excess region therein. As a method for introducing oxygen, an ion implantation method, an ion doping method, a plasma immersion ion implantation method, plasma treatment, or the like may be employed.

In the case where hafnium oxide is used for the insulating layers 931 and 932, the following effect is attained. Hafnium oxide has a higher dielectric constant than silicon oxide and silicon oxynitride. Therefore, when hafnium oxide is used, a thickness can be made larger than when silicon oxide is used; thus, leakage current due to tunnel current can be low, so that leakage current due to tunnel current can be reduced.

In this embodiment, a silicon nitride film is formed as the insulating layer 931, and a silicon oxide layer is formed as the insulating layer 932. A silicon nitride film has a higher dielectric constant than a silicon oxide film and needs a larger thickness to obtain a capacitance equivalent to that of the silicon oxide film. Thus, when a silicon nitride film is used for the gate insulating film 930 of the transistor, the physical thickness of the gate insulating film can be increased. Hence, the electrostatic breakdown of the transistor can be prevented by improving the withstand voltage of the transistor.

The oxide semiconductor layer 940 is typically formed using an In—Ga oxide, an In—Zn oxide, or an In-M-Zn oxide (M is Ti, Ga, Y, Zr, La, Ce, Nd, Sn, or Hf). In particular, an In-M-Zn oxide is preferably used for the oxide semiconductor layer 940.

In the case where the oxide semiconductor layer 940 is an In-M-Zn oxide, the atomic ratio of metal elements of a sputtering target used for forming a film of the In-M-Zn oxide and that of the formed oxide semiconductor layer are not necessarily consistent with each other and different within a range of ±40%. For example, the deposition using a sputtering target of In:M:Zn=4:2:4.1 gives a film with an atomic ratio of approximately In:M:Zn=4:2:3.

The energy gap of the oxide semiconductor layer 940 is 2 eV or more, preferably 2.5 eV or more, and more preferably 3 eV or more. The use of an oxide semiconductor having a wide energy gap in this manner enables the reduction of the off-state current of a transistor.

The oxide semiconductor layer 940 has a thickness greater than or equal to 3 nm and less than or equal to 200 nm, preferably greater than or equal to 3 nm and less than or equal to 100 nm, and further preferably greater than or equal to 3 nm and less than or equal to 50 nm.

An oxide semiconductor layer with low carrier density is used as the oxide semiconductor layer 940. For example, an oxide semiconductor layer whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$ is used as the oxide semiconductor layer 940.

In the oxide semiconductor layer, hydrogen, nitrogen, carbon, silicon, and a metal element other than main components are impurities. For example, hydrogen and nitrogen form donor levels to increase the carrier density. Silicon forms impurity levels in the oxide semiconductor layer. The impurity level becomes a trap, which deteriorates the electrical characteristics of the transistor. It is preferable to reduce the concentration of the impurities in the oxide semiconductor layer and at interfaces with other layers.

Stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In order to make the oxide semiconductor layer intrinsic or substantially intrinsic, the concentration of silicon in a part of or the whole of the oxide semiconductor layer is preferably controlled to be lower than $1\times10^{19}$ atoms/cm$^3$, lower than $5\times10^{18}$ atoms/cm$^3$, or lower than $1\times10^{18}$ atoms/cm$^3$. The concentration of hydrogen is preferably controlled to be lower than or equal to $2\times10^{20}$ atoms/cm$^3$, lower than or equal to $5\times10^{19}$ atoms/cm$^3$, lower than or equal to $1\times10^{19}$ atoms/cm$^3$, or lower than or equal to $5\times10^{18}$ atoms/cm$^3$. The concentration of nitrogen is preferably controlled to be lower than $5\times10^{19}$ atoms/cm$^3$, lower than or equal to $5\times10^{18}$ atoms/cm$^3$, lower than or equal to $1\times10^{18}$ atoms/cm$^3$, or lower than or equal to $5\times10^{17}$ atoms/cm$^3$. The concentration of these impurities can be obtained by a SIMS (secondary ion mass spectrometry) analysis.

In the case where the oxide semiconductor layer includes silicon or carbon, the crystallinity might be reduced. In order not to lower the crystallinity of the oxide semiconductor layer, for example, the concentration of silicon of a part of or the whole of the oxide semiconductor layer is controlled to be lower than $1\times10^{19}$ atoms/cm$^3$, lower than $5\times10^{18}$ atoms/cm$^3$, or lower than $1\times10^{18}$ atoms/cm$^3$. The concentration of carbon is controlled to be lower than $1\times10^{19}$ atoms/cm$^3$, lower than $5\times10^{18}$ atoms/cm$^3$, or lower than $1\times10^{18}$ atoms/cm$^3$.

Various experiments have proven the low off-state current of a transistor including a highly purified oxide semiconductor layer in a channel formation region. For example, a transistor having a channel width of $1\times10^6$ μm and a channel length of 10 μm exhibits an off-state current of less than or equal to the measurement limit of a semiconductor parameter analyzer, i.e., less than or equal to $1\times10^{-13}$ A, at voltage (drain voltage) between the source electrode and the drain electrode of from 1 V to 10 V. This value corresponds to an off-state current per channel width of lower than or equal to 100 zA/μm. A more detailed measurement has revealed an extremely low off-state current of several tens yoctoamperes (yA/μm) at a drain voltage of 3 V. Thus, the off-state current of the transistor including a channel formation region formed of the highly purified oxide semiconductor layer is considerably lower than that of a transistor including silicon having crystallinity.

In the case of using an In-M-Zn oxide for the oxide semiconductor layer 940, when Zn and O are eliminated from consideration, the proportion of In and the proportion of M are greater than 25 atomic % and less than 75 atomic %, respectively, preferably greater than 34 atomic % and less than 66 atomic %, respectively.

In order to obtain required semiconductor characteristics and electrical characteristics (e.g., field-effect mobility and threshold voltage) of a transistor, the carrier density, the impurity concentration, the defect density, the composition, and the like are appropriately controlled.

Figure 19A:
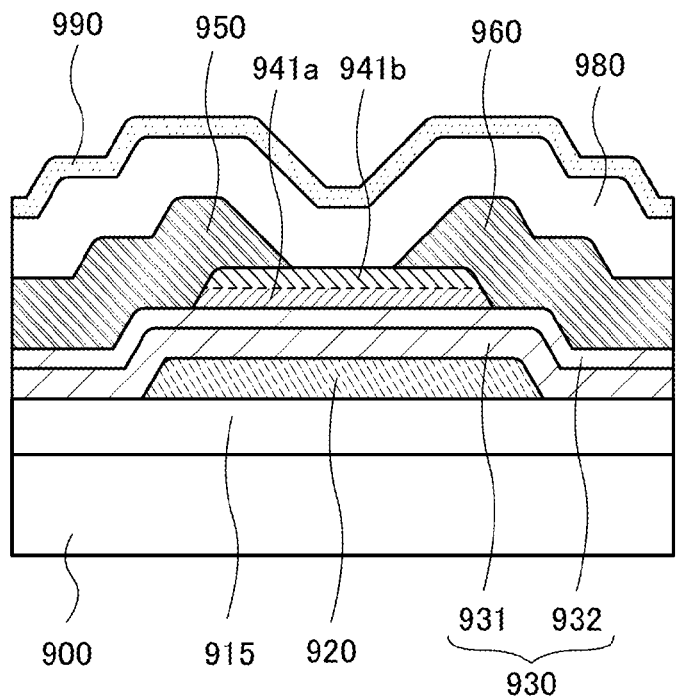
FIGS. 19A and 19B are cross-sectional views of transistors.

The oxide semiconductor layer 940 may have a structure in which a plurality of oxide semiconductor layers are stacked. For example, as in a transistor illustrated in FIG. 19A, stacked layers of an oxide semiconductor layer 941a and an oxide semiconductor layer 941b may constitute the oxide semiconductor layer 940. The oxide semiconductor layer 941a and the oxide semiconductor layer 941b may have different composition. For example, one of the oxide semiconductor layers may include one of an oxide containing two kinds of metals, an oxide containing three kinds of metals, and an oxide containing four kinds of metals, and the other of the oxide semiconductor layers may include another one of the oxide containing two kinds of metals, the oxide containing three kinds of metals, and the oxide containing four kinds of metals.

Alternatively, the oxide semiconductor layer 941a and the oxide semiconductor layer 941b may include the same constituent elements with different atomic ratios. For example, one of the oxide semiconductor layers may be formed by using a target having an atomic ratio of In:M:Zn=1:1:1, 5:5:6, 3:1:2, 2:1:3, or 4:2:4.1, and the other of the oxide semiconductor layers may be formed by using a target having an atomic ratio of In:M:Zn=1:3:2, 1:3:4, 1:3:6, 1:4:5, 1:6:4, or 1:9:6.

In this case, one of the oxide semiconductor layers, which is closer to the gate electrode (the oxide semiconductor layer on the channel side), has an atomic ratio of In≥M; and the other oxide semiconductor layer, which is farther from the gate electrode (the oxide semiconductor layer on the back channel side), has an atomic ratio of In<M. In that case, a transistor with a high field-effect mobility can be manufactured. On the other hand, when the oxide semiconductor layer on the channel side has an atomic ratio of In<M and the oxide semiconductor layer on the back channel side has an atomic ratio of In≥M, it is possible to reduce the change in the threshold voltage of a transistor.

The oxide semiconductor layer of the transistor may have a three-layer structure. In that case, a first to a third layers may include the same constituent elements with different atomic ratios. A transistor including the oxide semiconductor layer with a three-layer structure will be described with reference to FIG. 19B. Note that a structure in which the oxide semiconductor layer has a stacked structure can be employed for other transistors described in this embodiment.

Figure 19B:
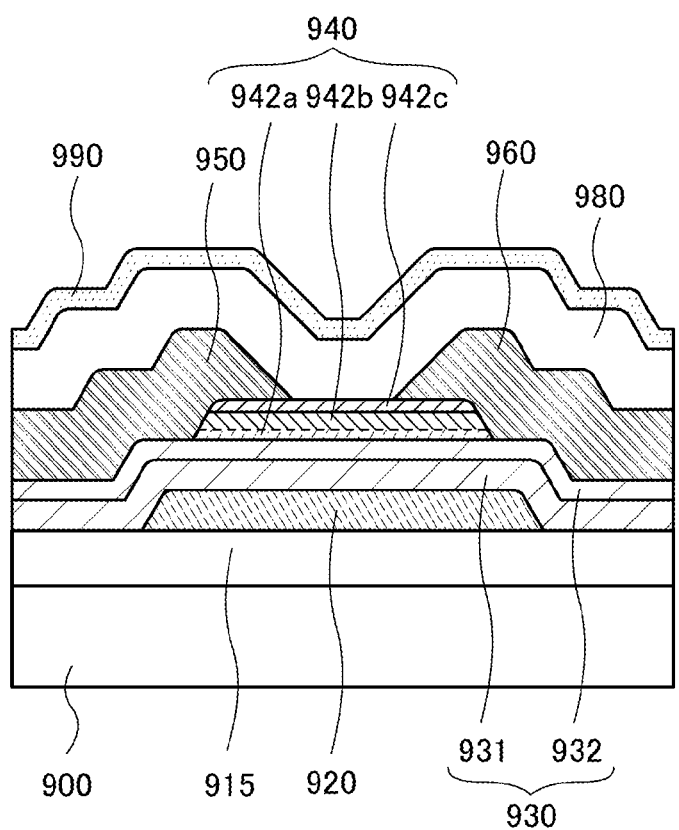

The transistor illustrated in FIG. 19B includes an oxide semiconductor layer 942a, an oxide semiconductor layer 942b, and an oxide semiconductor layer 942c which are stacked in this order from the gate insulating film side.

The oxide semiconductor layer 942a and the oxide semiconductor layer 942c may be formed using a material represented by $InM_{1x}Zn_yO_z$ (x≥1, y>1, z>0, $M_1$=Ga, Hf, or the like). The oxide semiconductor layer 942b may be formed using a material which can be represented by $InM_{2x}Zn_yO_z$ (x≥1, y≥x, z>0, $M_2$=Ga, Sn, or the like).

Materials of the semiconductor layers are selected as appropriate so as to form a well-shaped structure in which the conduction band minimum in the oxide semiconductor layer 942b is deeper from the vacuum level than the conduction band minimum in the oxide semiconductor layers 942c and 942a. Such a structure leads to the increase in field-effect mobility and the decrease in threshold voltage of the transistor.

For example, the oxide semiconductor layer 942a and the oxide semiconductor layer 942c may each have an atomic ratio of In:Ga:Zn=1:1:1, 1:3:2, 1:3:4, 1:3:6, 1:4:5, 1:6:4, or 1:9:6; the oxide semiconductor layer 942b may have an atomic ratio of In:Ga:Zn=1:1:1, 5:5:6, 3:1:2, 2:1:3, or 4:2:4.1.

Since the oxide semiconductor layers 942a, 942b, and 942c include the same constituent element, the oxide semiconductor layer 942b has few defect states (trap levels) at the interface with the oxide semiconductor layer 942a. Specifically, the defect states are fewer than those at the interface between the gate insulating film and the oxide semiconductor layer 942a. For this reason, when the oxide semiconductor layers are stacked in the above manner, the change in the threshold voltage of a transistor can be reduced.

The oxide semiconductor layers 942c to 942c may be formed using oxide semiconductors having different crystallinities. The oxide semiconductor layer 942b that can function as a channel formation region is preferably a film with crystallinity, further preferably a film in which c-axes are aligned in a direction substantially perpendicular to a surface.

For the source electrode layer 950 and the drain electrode layer 960, a conductive film having properties of extracting oxygen from the oxide semiconductor layer is preferably used. For example, Al, Cr, Cu, Ta, Ti, Mo, W, Ni, Mn, Nd, or Sc can be used. It is also possible to use an alloy or a conductive nitride of any of these materials. It is also possible to use a stack of a plurality of materials selected from these materials, alloys of these materials, and conductive nitrides of these materials. Typically, it is preferable to use Ti, which is particularly easily bonded to oxygen, or W, which has a high melting point and thus allows subsequent process temperatures to be relatively high. Alternatively, Cu or a Cu—X alloy (X indicates Mn, Ni, Cr, Fe, Co, Mo, Ta, or Ti), which has low resistance, may be used. Further alternatively, a stacked layer including any of the above materials and Cu or Cu— X alloy may be used.

In the case of using Cu—X alloy, a covering film might be spontaneously formed in a region in contact with the oxide semiconductor layer or a region in contact with an insulating film by heat treatment. The covering film includes a compound containing X such as an oxide of X an In—X oxide, a Ga—X oxide, an In—Ga—X oxide, and In—Ga—Zn—X oxide. The covering film functions as a blocking film, and Cu in the Cu—X alloy film can be prevented from entering the oxide semiconductor layer.

By the conductive film capable of extracting oxygen from the oxide semiconductor layer, oxygen in the oxide semiconductor layer is released to form oxygen vacancies in the oxide semiconductor film. Hydrogen slightly contained in the film enters the oxygen vacancy, whereby the region is changed to an absolutely n-type region. The n-type region serves as a source or a drain region of the transistor.

The films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

The structure described in this embodiment can be used in appropriate combination with the structure described in any of the other embodiments.

Embodiment 5

A structure of an oxide semiconductor film which can be used for one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

A combined analysis image (also referred to as a high-resolution TEM image) of a bright-field image and a diffraction pattern of the CAAC-OS film with a transmission electron microscope (TEM) allows a plurality of crystal parts to be observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When the CAAC-OS film including an $InGaZnO_4$ crystal is analyzed, for example, by an out-of-plane method with an X-ray diffraction (XRD) apparatus, a peak appears at a diffraction angle (2θ) of 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an $InGaZnO_4$ crystal is analyzed by an out-of-plane method, a peak of 2θ may also be observed at 36°, in addition to the peak of 2θ at 31°. The peak of 2θ at 36° indicates that a crystal having no c-axis alignment is included in part of the CAAC-OS film. It is preferable that in the CAAC-OS film, a peak of 2θ appear at 31° and a peak of 2θ not appear at 36°.

The CAAC-OS film is an oxide semiconductor film having low impurity concentration. An element that has higher bonding strength to oxygen than a metal element included in the oxide semiconductor film, such as silicon, disturbs the atomic arrangement of the oxide semiconductor film by abstracting oxygen from the oxide semiconductor film and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity. Note that the impurity contained in the oxide semiconductor film might serve as a carrier trap or a carrier generation source.

The CAAC-OS film is an oxide semiconductor film having a low density of defect states.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. In a nanobeam electron diffraction pattern of the nc-OS film, a plurality of circumferentially distributed spots are observed.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

An oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. In the high-resolution TEM image, there are a region where a crystal part is clearly observed and a region where a crystal part is not observed. In the a-like OS film, crystallization by a slight amount of electron beam used for TEM observation occurs and growth of the crystal part can be found. In contrast, crystallization is not observed in the nc-OS film when the electron-beam irradiation is carried out at a low intensity as in the TEM observation.

An oxide semiconductor film may be a stacked film including two or more films of an amorphous oxide semiconductor film, an a-like OS film, a microcrystalline oxide semiconductor film, and a CAAC-OS film, for example.

The structure described in this embodiment can be used in appropriate combination with the structure described in any of the other embodiments.

Embodiment 6

An imaging device according to one embodiment of the present invention and a semiconductor device including the imaging device can be used for display devices, personal computers, and image reproducing devices provided with recording media (typically, devices that reproduce the content of recording media such as digital versatile discs (DVDs) and have displays for displaying the reproduced images). Other than the above, as an electronic appliances which can use the imaging device according to one embodiment of the present invention or the semiconductor device including the imaging device, mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, medical examination apparatus, and the like can be given. FIGS. 20A to 20E show specific examples of these electronic appliances.

Figure 20A:
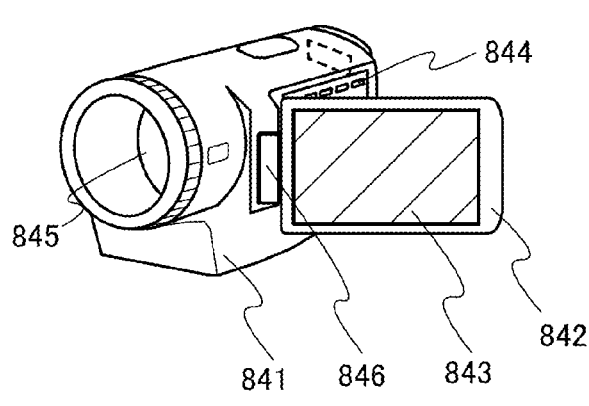
FIGS. 20A to 20E illustrate electronic appliances.

FIG. 20A illustrates a video camera including a first housing 841, a second housing 842, a display portion 843, operation keys 844, a lens 845, a joint 846, and the like. The operation keys 844 and the lens 845 are provided for the first housing 841, and the display portion 843 is provided for the second housing 842. The first housing 841 and the second housing 842 are connected to each other with the joint 846, and the angle between the first housing 841 and the second housing 842 can be changed with the joint 846. Images displayed on the display portion 843 may be switched in accordance with the angle at the joint 846 between the first housing 841 and the second housing 842. The imaging device of one embodiment of the present invention can be provided in a focus position of the lens 845.

Figure 20B:
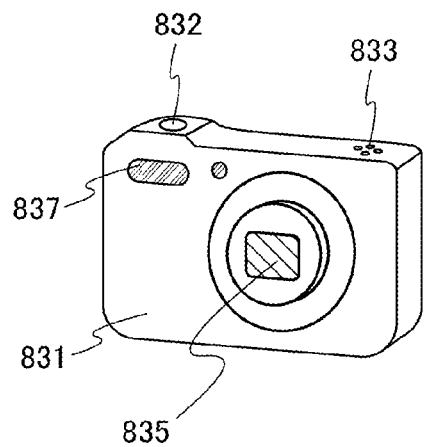

FIG. 20B illustrates a digital camera including a housing 831, a shutter button 832, a microphone 833, a light-emitting portion 837, a lens 835, and the like. The imaging device of one embodiment of the present invention can be provided in a focus position of the lens 825.

Figure 20C:
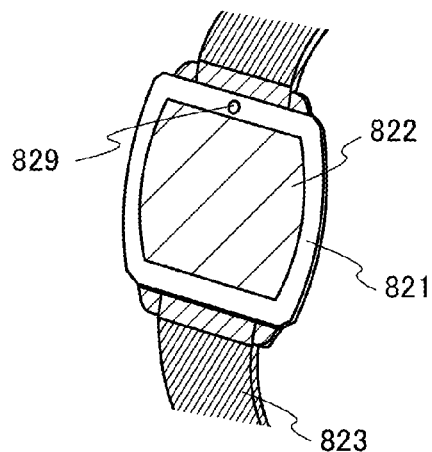

FIG. 20C illustrates a wrist-watch-type information terminal, which includes a housing 821, a display portion 822, a wristband 823, a camera 829, and the like. The display portion 822 may be a touch panel. The imaging device of one embodiment of the present invention can be used in the camera 829.

Figure 20D:
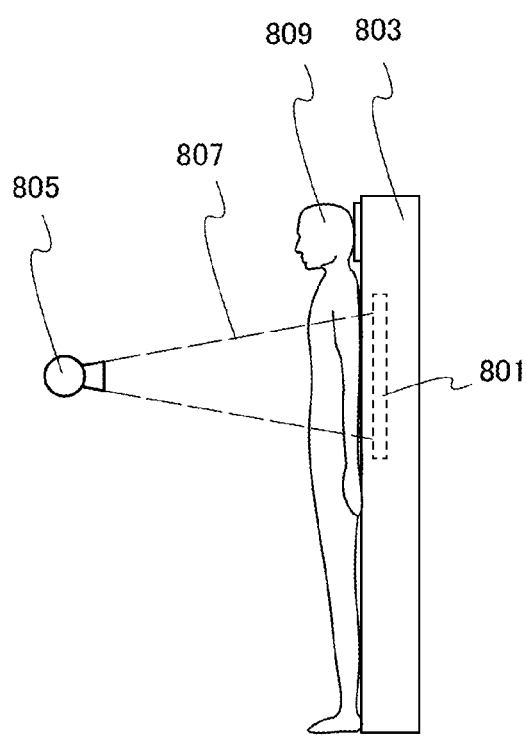

FIG. 20D illustrates a radiation imaging system, which includes a radiation source 805, a stand 803, and a flat panel detector 801. A radiation 807 that is emitted from the radiation source 805 and transmitted through an object 809 is detected by the flat panel detector 801 installed in the stand 803, whereby an image can be obtained. The imaging device of one embodiment of the present invention can be used in the flat panel detector 801.

Figure 20E:
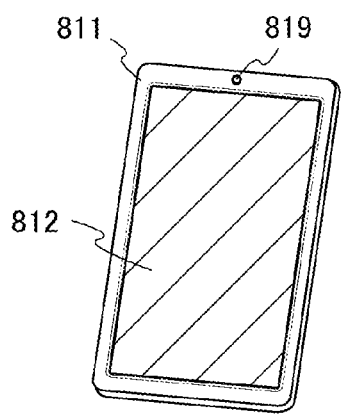

FIG. 20E illustrates a portable data terminal, which includes a first housing 811, a display portion 812, a camera 819, and the like. A touch panel included in the display portion 812 enables input of information. The display portion has an image sensor function. The imaging device of one embodiment of the present invention can be used in the camera 819 and the display portion 812.

The structure described in this embodiment can be used in appropriate combination with the structure described in any of the other embodiments.

This application is based on Japanese Patent Application serial no. 2014-120472 filed with Japan Patent Office on Jun. 11, 2014, the entire contents of which are hereby incorporated by reference.

What is claimed is:

1. A semiconductor device comprising:
a first transistor and a second transistor each comprising:
   a first gate electrode;
   a first semiconductor layer over the first gate electrode;
   a source electrode; and
   a drain electrode; and
a photodiode overlapping with the first transistor and the second transistor and comprising:
   an anode electrode;
   a second semiconductor layer over the anode electrode; and
   a cathode electrode over the second semiconductor layer,
wherein the anode electrode is shared by the first transistor and the second transistor and is configured to function as a second gate electrode of the first transistor and a second gate electrode of the second transistor, and
wherein the first semiconductor layer of the first transistor is sandwiched between the first gate electrode of the first transistor and the second gate electrode of the first transistor.

2. The semiconductor device according to claim 1, further comprising a capacitor under the photodiode,
wherein one of the source electrode and the drain electrode of the first transistor extends to the capacitor and is configured to function as one of electrodes of the capacitor,
wherein the anode electrode is configured to function as the other of the electrodes of the capacitor, and
wherein a dielectric is interposed between the electrodes.

3. The semiconductor device according to claim 1,
wherein the cathode electrode is electrically connected to one of the source electrode and the drain electrode of the first transistor.

4. The semiconductor device according to claim 1,
wherein the first semiconductor layer of the first transistor comprises an oxide semiconductor.

5. The semiconductor device according to claim 1,
wherein the first semiconductor layer of the second transistor comprises an oxide semiconductor.

6. The semiconductor device according to claim 1,
wherein the anode electrode comprises a metal nitride.

7. The semiconductor device according to claim 1, further comprising a hydrogen barrier film between the first transistor and the anode electrode.

8. The semiconductor device according to claim 1, further comprising an insulating layer in direct contact with the second semiconductor layer in a region over the first transistor.

9. The semiconductor device according to claim 1, further comprising an insulating layer in direct contact with the second semiconductor layer in a region over the second transistor.

10. The semiconductor device according to claim 1, further comprising an insulating layer in direct contact with the anode electrode in a region over the first transistor.

11. The semiconductor device according to claim 1, further comprising an insulating layer in direct contact with the anode electrode in a region over the second transistor.

12. A semiconductor device comprising:
a first transistor and a second transistor each comprising:
a first gate electrode;
a first semiconductor layer over the first gate electrode;
a source electrode; and
a drain electrode;
a photodiode overlapping with the first transistor and the second transistor and comprising:
an anode electrode;
a third semiconductor layer over the anode electrode;
a second semiconductor layer over the third semiconductor layer;
a fourth semiconductor layer over the second semiconductor layer; and
a cathode electrode over the fourth semiconductor layer; and
an insulating layer over the cathode electrode,
wherein the anode electrode is shared by the first transistor and the second transistor and is configured to function as a second gate electrode of the first transistor and a second gate electrode of the second transistor, and
wherein the first semiconductor layer of the first transistor is sandwiched between the first gate electrode of the first transistor and the second gate electrode of the first transistor.

13. The semiconductor device according to claim 12, wherein the insulating layer is in direct contact with the second semiconductor layer in a region over the first transistor.

14. The semiconductor device according to claim 12, wherein the insulating layer is in direct contact with the second semiconductor layer in a region over the second transistor.

15. The semiconductor device according to claim 12, wherein the insulating layer is in direct contact with the third semiconductor layer in a region over the first transistor.

16. The semiconductor device according to claim 12, wherein the insulating layer is in direct contact with the third semiconductor layer in a region over the second transistor.

17. The semiconductor device according to claim 12, wherein the insulating layer is in direct contact with the anode electrode in a region over the first transistor.

18. The semiconductor device according to claim 12, wherein the insulating layer is in direct contact with the anode electrode in a region over the second transistor.

19. The semiconductor device according to claim 12, wherein the cathode electrode is electrically connected to one of the source electrode and the drain electrode of the first transistor.

20. The semiconductor device according to claim 12, wherein the first semiconductor layer of the first transistor comprises an oxide semiconductor.

21. The semiconductor device according to claim 12, wherein the first semiconductor layer of the second transistor comprises an oxide semiconductor.

22. A semiconductor device comprising:
a first transistor and a second transistor each comprising:
a first gate electrode;
a first semiconductor layer over the first gate electrode;
a source electrode; and
a drain electrode;
a capacitor comprising:
a first electrode which is shared by the first transistor and is configured to function as one of the source electrode and the drain electrode of the first transistor;
a dielectric over the first electrode; and
a second electrode over the dielectric;
a photodiode overlapping with the first transistor, the second transistor, and the capacitor, and comprising:
an anode electrode;
a third semiconductor layer over the anode electrode;
a second semiconductor layer over the third semiconductor layer;
a fourth semiconductor layer over the second semiconductor layer; and
a cathode electrode over the fourth semiconductor layer; and
an insulating layer over the cathode electrode,
wherein the anode electrode is shared by the first transistor, the second transistor, and the capacitor and is configured to function as a second gate electrode of the first transistor, a second gate electrode of the second transistor, and the second electrode of the capacitor.

23. The semiconductor device according to claim 22, wherein the insulating layer is in direct contact with the second semiconductor layer in a region over the capacitor.

24. The semiconductor device according to claim 22, wherein the insulating layer is in direct contact with the third semiconductor layer in a region over the capacitor.

25. The semiconductor device according to claim 22, wherein the insulating layer is in direct contact with the anode electrode in a region over the capacitor.

26. The semiconductor device according to claim 22, wherein the cathode electrode is electrically connected to the other of the source electrode and the drain electrode of the first transistor.

* * * * *